United States Patent [19]

Takamura et al.

[11] Patent Number: 4,631,725
[45] Date of Patent: Dec. 23, 1986

[54] ERROR CORRECTING AND DETECTING SYSTEM

[75] Inventors: Moriyuki Takamura, Yokohama; Shigeru Mukasa, Machida; Takashi Ibi, Kawasaki, all of Japan

[73] Assignee: Fujitsu Limited, Kawasaki, Japan

[21] Appl. No.: 686,815

[22] Filed: Dec. 27, 1984

[30] Foreign Application Priority Data

Dec. 28, 1983 [JP] Japan .................................. 58-250004

[51] Int. Cl.⁴ ............................................ G06F 11/10
[52] U.S. Cl. ........................................ 371/39; 371/37; 371/40
[58] Field of Search .......................... 371/37, 38, 39, 40

[56] References Cited

U.S. PATENT DOCUMENTS

| | | | |
|---|---|---|---|
| 3,958,220 | 5/1976 | Marshall | 371/39 |
| 4,107,650 | 8/1978 | Luke | 371/40 |
| 4,546,474 | 10/1985 | Sako | 371/39 |
| 4,562,578 | 12/1985 | Odaka | 371/39 |
| 4,569,050 | 2/1986 | Ohme | 371/40 |

Primary Examiner—Michael R. Fleming
Attorney, Agent, or Firm—Armstrong, Nikaido, Marmelstein & Kubovcik

[57] ABSTRACT

An error correcting and detecting system using a parity check H-matrix divided into a plurality of block vectors each including four or three column vectors each having eight elements. In the H-matrix, (i) there are no all "0" vectors; (ii) all column vectors are different from each other; (iii) 8 column vectors each having only one "1" is included therein, (iv) each column vector has an odd number of "1's"; (v) the modulo-2 sum of any three column vectors within any block never equals any column vectors of the H-matrix; (vi) the modulo-2 sum of four column vectors within any block never equals an all "0" vector; and (vii) the modulo-2 sum of eight column vectors within any two blocks never equals an all "0" vector.

8 Claims, 18 Drawing Figures

| BLOCK 1 | BLOCK 2 | BLOCK 3 | BLOCK 4 | | | | | | BLOCK 9 | | | BLOCK 10 |
|---|---|---|---|---|---|---|---|---|---|---|---|---|
| DDDD | DDCD | CDCD | DDDD | DDDD | DDCD | DDDD | DCDD | DCDD | DDCD | DDC | | |
| 0000 | 00 0 | 0 0 | 0111 | 1111 | 11 2 | 2222 | 2 22 | 22 22 | 3 3 | 3 3 | | |
| 1234 | 5627 | 6819 | 0123 | 4567 | 8930 | 1234 | 5467 | 8900 | 125 | | | |
| 1000 | 0100 | 0101 | 0010 | 1111 | 0001 | 0100 | 0001 | 0011 | 100 | | | |
| 0010 | 0001 | 0011 | 1100 | 0001 | 0100 | 1000 | 0001 | 1001 | 010 | | | |
| 0100 | 0010 | 0001 | 1000 | 0110 | 1000 | 1010 | 0001 | 1100 | 100 | | | |
| 0001 | 0001 | 0000 | 0001 | 1001 | 1010 | 0101 | 0101 | 0100 | 110 | | | |
| 0001 | 1100 | 0000 | 0010 | 0010 | 1001 | 0111 | 0100 | 0100 | 000 | | | |
| 0011 | 1100 | 0100 | 0011 | 1000 | 0101 | 0010 | 1000 | 0000 | 001 | | | |
| 0011 | 1000 | 1000 | 0001 | 1000 | 0101 | 0001 | 1010 | 0100 | 010 | | | |

ERROR CORRECTING AND DETECTING SYSTEM

BACKGROUND OF THE INVENTION (1) Field of the Invention

The present invention relates to an error correcting and detecting system, using error check and correction (ECC) codes, in which single-bit errors are corrected, double-bit errors are detected, triple-bit block errors are detected, quadruple-bit block errors are detected, and 8-bit burst block errors of within any two blocks are detected.

(2) Description of the Related Art

To ensure data integrity and improve the reliability of memory units, error correcting and detecting systems using ECC codes have recently been developed.

ECC codes originated with the Hamming codes disclosed in R. W. Hamming, "Error Detecting and Error Correcting Codes", Bell System Tech. J., vol. 29, No. 2, pp. 147 to 160, April 1950. Hamming codes were used to correct single-bit errors and detect double-bit errors and, therefore, are also called "SEC-DED" codes.

M. Y. Hsiao provided improved Hamming SEC-DED codes to enhance the decoding speed and improve the detection rate of multiple-bit errors (see: "A Class of Optimal Minimum Odd-weight-Column SEC-DED Codes," IBM J. Res. Develop., vol. 14, pp. 395 to 401, July 1970). These "Hsiao" SEC-DED codes have since come into broad use in general-purpose large-scale computers.

The above-mentioned SEC-DED codes are very helpful in ensuring data integrity of memory units and improving the reliability thereof, since the failure mode of an element of a memory unit, i.e., a memory chip is a single-bit error. It is therefore even more effective to construct memory chips, boards, and modules in one-bit configurations.

The remarkable increase in the integration of memory chips and in the density of memory unit packaging, however, means it is no longer practical to construct memory chips, boards, and modules in one-bit configurations in view of memory unit capability, performance, and packaging. Memory chips, boards, and modules are now constructed in multiple-bit configurations, such as 4-bit or 8-bit configurations. For example, a 64K bit memory chip is constructed as 16K words×4 bits or 8K words×8 bits.

When a plurality of such memory chips are mounted on a memory board or module, the board or module also take on multiple-bit configurations.

In a memory unit constructed by memory chips, boards, or modules of multiple-bit configurations, however, there is a possibility of block (lump) errors in data due to failure of only one of the constituents. In other words, part or all of the bits of a block may be erroneous. It is important to detect such block errors to ensure the data integrity and reliability of memory units.

Here "block" means the multiple-bit configuration. If "b" is the number of bits forming a block, b=4 or b=8 on the above-mentioned memory units.

In view of the, foregoing, proposals have been made for single-bit error correcting, single "b" bit block error detecting (SEC-SbBED) codes and single-bit error correcting, double-bit error detecting, single "b"bit block error detecting (SEC-DED-SbBED) codes.

SEC-SbBED codes are disclosed in Bossen, Chang and Chen, "Measurement and Generation of Error Correcting Codes for Package Failures," IEEE Trans. Comput., vol. C-27, No. 3, pp. 201 to 204, March 1973. With SEC-SbBED codes, the number of check bits (or redundancy bits) is $$b+ \lceil \log_2(r+1) \rceil -1$$

where b: the number of bits within one block;

r: the number of blocks within one codeword; and $\lceil p \rceil$: the smallest integer greater than or equal to p.

For example, if b=4 and r=18, then the number of check bits is $4+ \lceil \log_2 19 \rceil -1=8$. Thus, a (72, 64) SEC-S4BED code is established. Here, (n, k) is defined by n: the number of bits per one codeword and k: the number of data bits per one codeword. Also, if b=4 and r=10, the number of check bits is $4+ \lceil \log_2 11 \rceil -1=7$. Thus, a (39, 32) SEC-S4BED code is established.

SEC-DED-SbBED codes are disclosed in S. M. Reddy, "A Class of Linear Codes for Error Control in Byte-per-Card Organized Digital Systems," IEEE Trans. Comput., vol. C-27, No. 5, pp. 455 to 459, May 1978 and Dunning and Varanasi, "Code Construction for Error Control in Byte Organized Memory Systems," IEEE Trans. Comput., vol. C-32, No. 6, pp. 535 to 542, June 1983.

With Reddy codes, (i) if $2 \leq b \leq 4$, $b+ \lceil \log_2(r+1) \rceil -1$ check bits are required for the SEC-SbBED codes, and one additional check bit is required for the SEC-DED-SbBED codes, and (ii) if $b \geq 5$, $b+ \lceil \log_2(r+1) \rceil -1$ check bits are required for the SEC-DED-SbBED codes.

Therefore, according to the Reddy codes, if b=4 and r=18, then a (73, 64) SEC-DED-S4BED code is established. If b=4 and r=10, then a (40, 32) SEC-DED-S4BED code is established.

On the other hand, according to the Dunning and Varanasi codes, b+2 check bits are required for the SEC-SbBED codes. In addition, if $b \geq 7$, then $b+ \lceil \log_2(r+b+1)/(b+1) \rceil +1$ check bits are required for the SEC-DED-SbBED codes. If b<7, a larger number of check bits are required for a double-bit error detection (DED) as compared with the Reddy codes.

Unexamined Japanese Patent Publication (Kokai) No. 58-78241, published on May 11, 1983, discloses a (72, 64) SEC-DED-S4BED code.

None of the above-mentioned prior art publications, however, disclose the detection of an 8-bit burst error within any two blocks of a codeword.

SUMMARY OF THE INVENTION

It is a principal object of the present invention to provide a (72, 64) SEC-DED-S4BED-double-4-bit block burst error detecting (D4UED) code in the case where b=4 and an error correcting and detecting system using the same code.

It is another object of the present invention to provide a (40, 32) SEC-DED-S4BED-D4UED code in the case where b=4, and an error correcting and detecting system using the same code.

It is still another object of the present invention to provide a (39, 32) SEC-DED-S4BED-D4UED code in the case where b=4, and an error correcting and detecting system using the same code.

The number of check bits of the SEC-DED-S4BED-D4UED codes according to the present invention is the same as that of the prior art SEC-DED-S4BED codes. That is, there are 7 bits or 8 bits of check bits according to the present invention. The error correcting and detecting system according to the present invention can detect an eight-bit burst error within any two blocks in addition to the correction of single-bit errors (SEC), the detection of double-bit errors (DED), and the detection of single 4-bit block errors (S4BED), without modifying the coding and decoding time period in the prior art error correcting and detecting systems.

BRIEF DESCRIPTION OF THE DRAWINGS

The present invention will be more clearly understood from the description as set forth below with reference to the accompanying drawings, wherein:

FIGS. 1 through 3 are diagrams of parity check H-matrixes according to the present invention;

DESCRIPTION OF THE PREFERRED EMBODIMENTS

Figure 4:
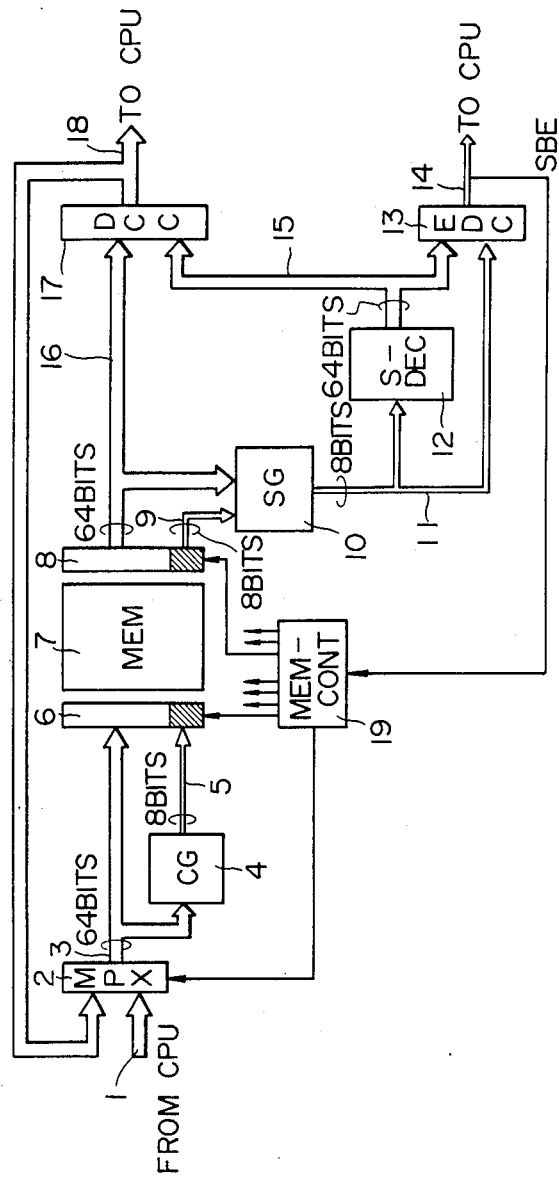
FIG. 4 is a block diagram of a first embodiment of the error correcting and detecting system according to the present invention.

The parameters used in the coding theory according to the present invention are defiend as follows.

b: number of bits within one block;
r: number of blocks within one codeword;
n: number of bits within one codeword;
c: number of check (redundancy) bits within one codeword; and
k: number of data bits within one codeword.

Therefore, $n = br = c + k$. As is well known, a linear binary error correction code can be represented by a parity check H-matrix. The parity check H-matrix is given by a c-row, n-column matrix where the elements are 0 and 1, i.e., $$H = \begin{pmatrix} h_{11}, h_{12}, \ldots, h_{1n} \\ h_{21}, h_{22}, \ldots, h_{2n} \\ h_{c1}, h_{c2}, \ldots, h_{cn} \end{pmatrix} \quad (1)$$

The H-matrix in formula (1) defines the rules or "grammar" for adding redundancy. The number of rows corresponds to the number of check bits, and the number of columns corresponds to the codeword length, i.e., the number of bits within one codeword. Here, a codeword is defiend by $T = T(t_1, t_2, \ldots, t_n)$, then $$HT^t = 0 \quad (2)$$

formula (2) defines a coding rule. Note that t means transposition.

In addition, if a tested codeword is defined as $R = R(R_1, R_2, \ldots, r_n)$ and an error pattern position is defined as $E = E(e_1, e_2, \ldots, e_n)$, then $$R = T \oplus E \quad (3)$$
$$= (t_1 \oplus e_1, \ldots, t_n \oplus e_n)$$

A syndrome S is given from the formula (2) by $$S = HR^t = H(T \oplus E)^t = HE^t \quad (4)$$

Therefore, if $S \neq 0$, then no error is generated, while if $S = 0$, then errors are generated. Also, an error is corrected by $T = R \oplus E$ obtained from the formula (4). For example, regarding a single-bit error, a syndrome S for bit position i is given by the i-th column of the H-matrix. This defines a decoding rule.

The column vectors of the H-matrix according to the present invention should satisfy the following conditions (i) to (vii).

(i) There are no all "0" vectors.

(ii) All the column vectors are different from each other.

(iii) There are only c number of column vectors having only one "1".

(iv) Each column vector has an odd number of "1's". That is, each column vector is an odd-weight vector.

(v) The single column vector obtained by the modulo-2 sum of bits of the three column vectors of any $$\binom{4}{3}$$

combination of the four column vectors in any block does not coincide with a column vector of the H-matrix.

(vi) The single column vector obtained by the modulo-2 sum of bits of the four column vectors of any block is not the all "0" vector.

(vii) The single column vector obtained by the modulo-2 sum of bits of the eight column vectors of any two blocks is not the all "0" vector.

The conditions (i), (ii), (iii), and (iv) are satisfied by the SEC-DED codes according to the M. Y. Hsiao theory. In addition, since the modulo-2 sum of any three odd-weight vectors is always an odd-weight vector, this modulo-2 sum never equals the all "0"vector. Therefore, if condition (V) is satisfied, a triple-bit error within any block can be detected. Further, since the modulo-2 sum of any four odd-weight vectors is always an even-weight vector, including the all "0" vector, if condition (vi) is satisfied, a quadruple-bit error within any block can be detected. Still further, since the modulo-2 sum of any eight odd-weight vectors is always an even-weight vector, including the all "0" vector, if condition (vii) is satisfied an eight-bit burst error within any two blocks can be detected.

The determination of column vectors satisfying the conditions (i) to (vii) will now be explained. The number of odd-weight column vectors is given by $$\sum_{j=1}^{\lambda} \binom{c}{j} \tag{5}$$

where $\lambda$ is an odd number not larger than c.

In the case where c=8, the number of odd-weight column vectors is $$\binom{8}{1} + \binom{8}{3} + \binom{8}{5} + \binom{8}{7}$$

$$= 8 + 56 + 56 + 8$$

$$= 128.$$

In the case where c=7, the number of odd-weight column vectors is $$\binom{7}{1} + \binom{7}{3} + \binom{7}{5}$$

$$= 7 + 35 + 21$$

$$= 63.$$

For conditions (i), (ii), (iii), and (iv), any of the odd-weight column vectors can be used. However, since the total number of "1's" in the H-matrix should be a minimum, for example, 72 odd-weight column vectors are selected from the combinations $$\binom{8}{1}, \binom{8}{3}, \text{ and } \binom{8}{5},$$

in that order, in the case of c=8, and , for example, 39 odd-weight column vectors are selected from the combinations $$\binom{7}{1} \text{ and } \binom{7}{3},$$

in that order, in the case of c=7.

Figure 5:
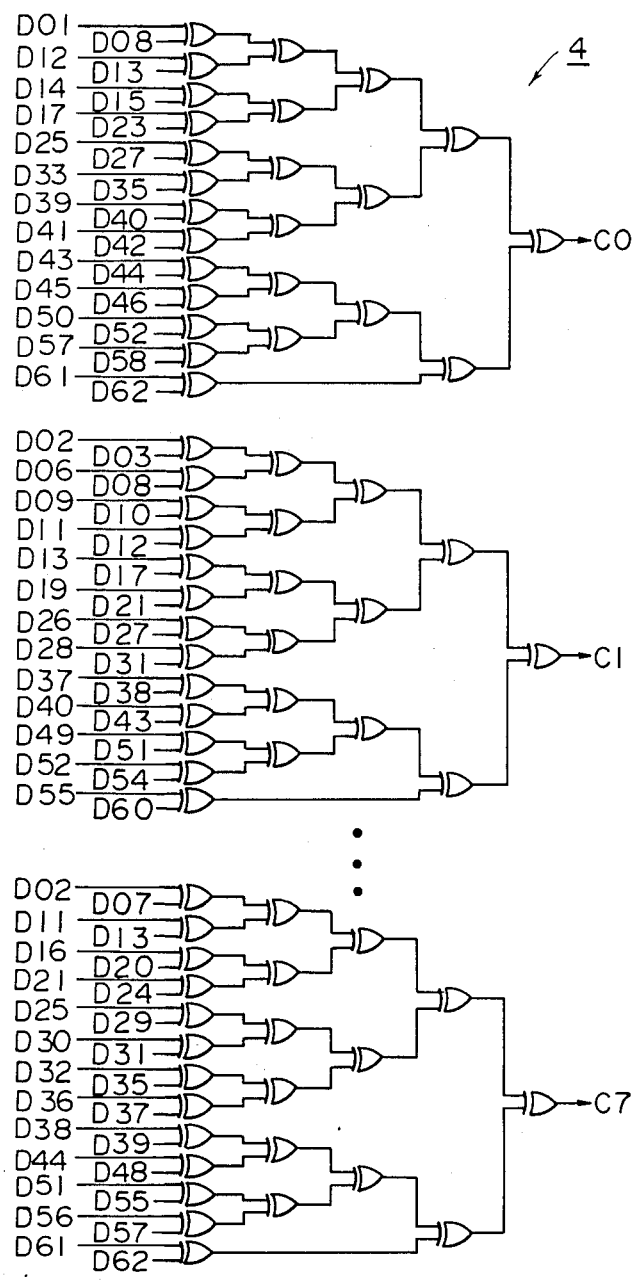
FIG. 5 is a logic circuit diagram of the check bit generating circuit of FIG. 4.
Figure 6:
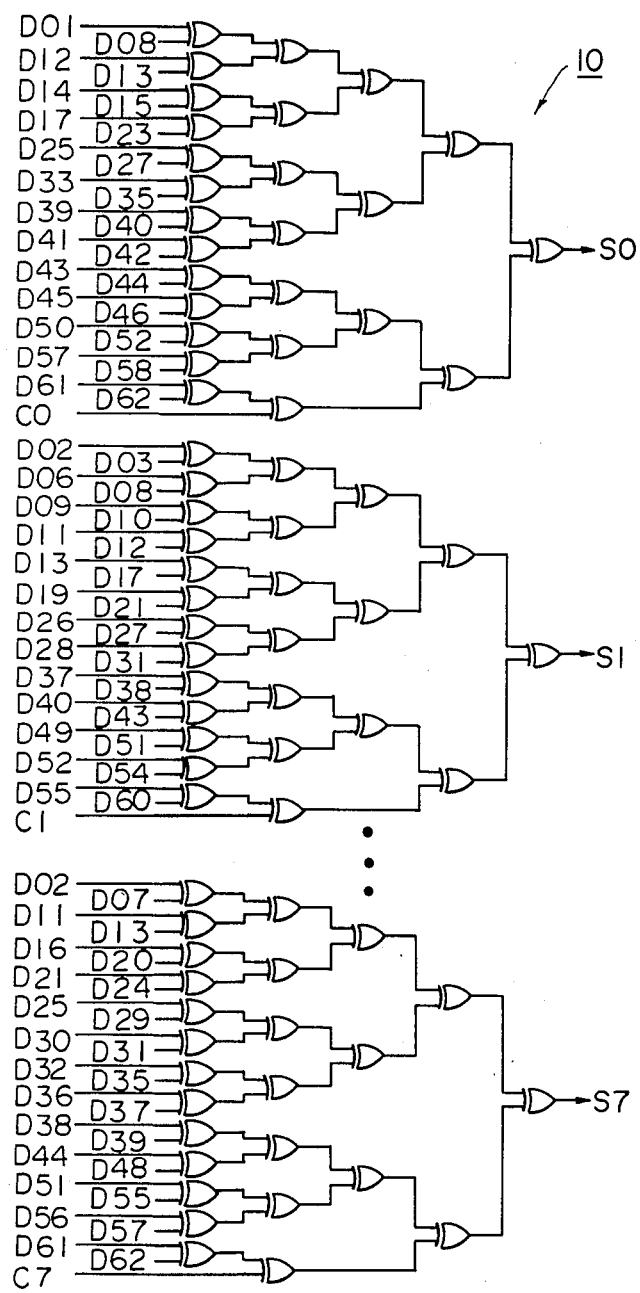
FIG. 6 is a logic circuit diagram of the syndrome generating circuit of FIG. 4.

Note that when the total number of "1's" in the H-matrix is a minimum, the total number of gates used in the check bit generating circuit and the syndrome generating circuit (see: FIGS. 5 and 6) is also a minimum, thereby reducing the check bit generating time period and the syndrome generating time period and also minimizing the failure rate of the circuits.

Thus, an initial H-matrix which satisfies conditions (i) to (iv) is established. Then, it is verified whether the column vectors thus established satisfy all conditions (V), (Vi), and (Vii). If a column vector does not satisfy these conditions, such a column vector is swapped with a column vector of another block or another column vector within the initial H-matrix. Such a swapping process is continued until all the column vectors of the H-matrix satisfy the conditions (V), (Vi), and (Vii).

It is most effective to execute the swapping process by using a computer.

Figure 1:
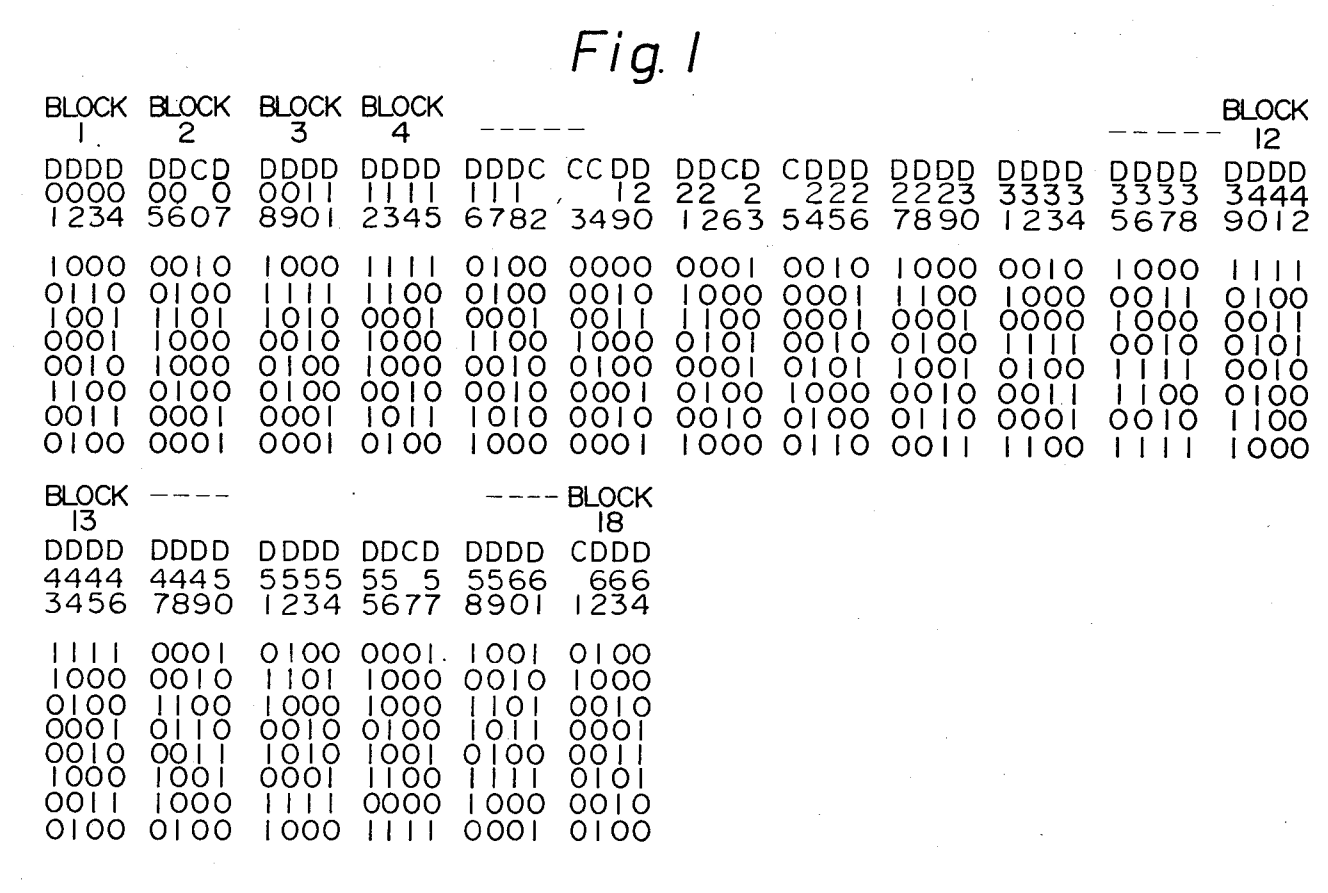
Figure 2:
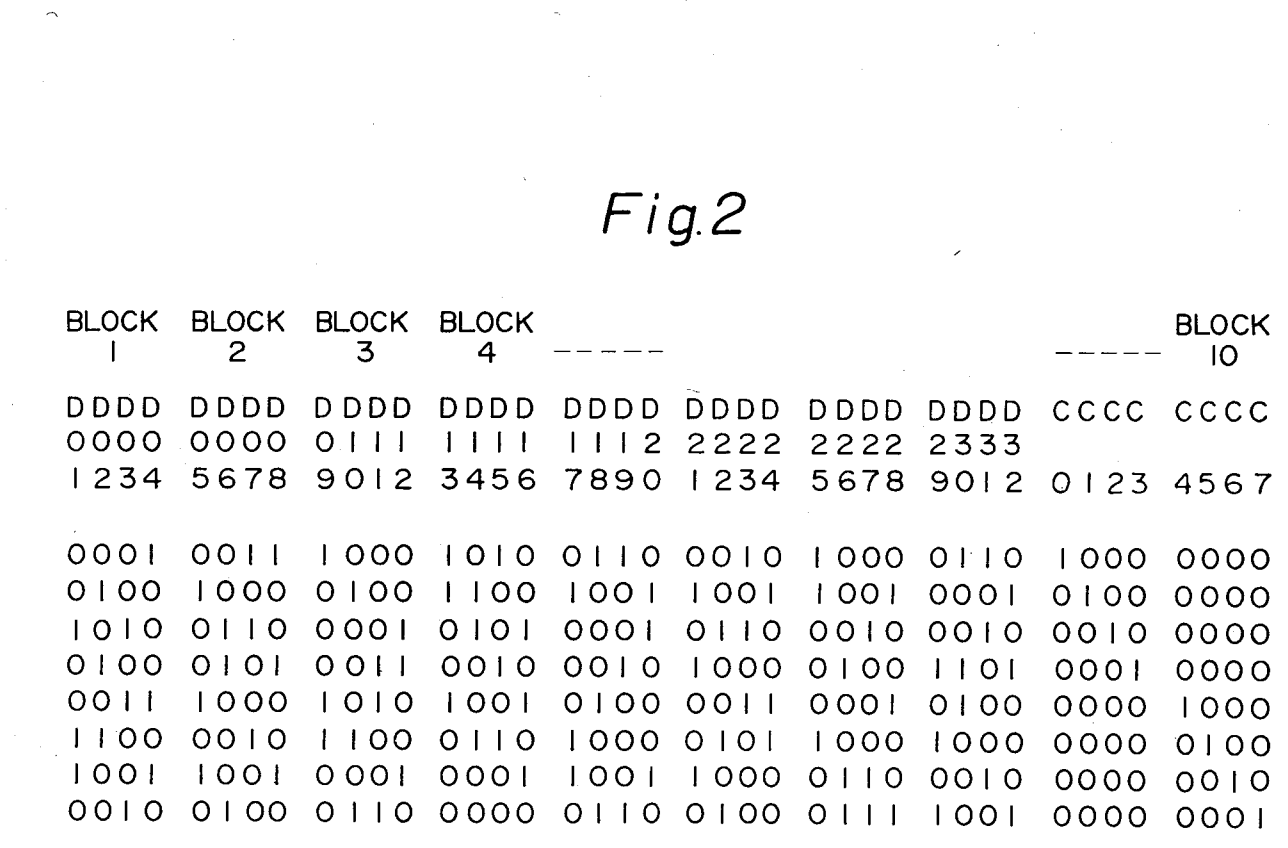

Examples of the H-matrix of the code according to the present invention are illustrated in FIG. 1, 2, and 3. That is, FIG. 1 represents the H-matrix of a (72, 64) SEC-DED-S4BED-D4UED code, FIG. 2 represents the H-matrix of a (40, 32) SEC-DED-S4BED-D4UED code, and FIG. 3 represents the H-matrix of a (39, 32) SEC-DED-S4BED-D4UED code.

In FIG. 4, which is a first embodiment of the present invention using the H-matrix of FIG. 1, reference numeral 1 designates a 64-bit write data line which is linked between a central processing unit (CPU, not shown) and a multiplexer 2. Also, connected to the multiplexer 2 is a corrected memory read data line 18. The multiplexer 2 multiplexes the write data line 1 and the corrected memory read data line 18 and connects one of the lines to a 64-bit write data line 3 which is connected to a check bit generating circuit 4 and to a write data register 6. The write data register 6 also receives 8 check bits from the check bit generating circuit 4 via an 8-bit check bit line 5. The 72-bit codeword formed by 64 data bits and 8 check bits are written into a memory unit 7, while the codeword stored in the memory unit 7 is read and transmitted to a read data register 8. The read data register 8 transmits both of the 64 data bits and 8 check bits via a 64-bit memory read data line 16 and an 8-bit read check bit line 9 to a syndrome generating circuit 10. The syndrome generating circuit 10 generates 8 syndrome bits and transmits them via an 8-bit syndrome line 11 to a syndrome decoding circuit 12 and an error detacting circuit 13. The error detecting circuit 13 also receives the decoding results of the syndrome decoding circuit 12 via a decoding line 15. Reference numeral 14 designates an error signal line which is connected to the CPU. The decoding results are also transmitted via the decoding line 15 to a data correcting circuit 17, which receives the 64 data bits via the memory read data line 16.

A memory write/read control circuit 19 controls the multiplexer 2, the write data register 6, the read data register 8, and the like.

During a write mode, the 64-bit write data transmitted from the unit (CPU) is transmitted via the multiplexer 2 to the check bit generating circuit 4 which produces check bits C0 to C7 (8 bits). These check bits and the write data are combined to produce a 72-bit codeword which is written via the write data register 6 into the memory unit 7. Thus, a write operation is completed.

Next, during a read mode, 72 bits of the stored codeword are read and are stored temporarily in the read data register 8. The data bits and the check bits of this codeword are transmitted to the syndrome generating circuit 10, while only the data bits are transmitted to the data correcting circuit 17. In the syndrome generating circuit 10, in the same way as the check bit generating circuit 4 generates check bits, 8 check bits are produced from the read data. These check bits are compared with the read check bits, so as to produce 8 syndrome bits S0 to S7. As a result of the comparison, if the bits of the syndrome bits S0 to S7 are all "0", no error has been occurred, while if one or more of the syndrome bits are "1", the presence of errors can be detected.

The syndrome bits S0 to S7 are transmitted to the syndrome decoding circuit 12. In the syndrome decoding circuit 12, the syndrome bits S0 to S7 are input to a decoder. If a single-bit error is generated, this decoder generates an output showing the location of this error. This output is transmitted to the data correcting circuit 17 in which the error bit of the read data transmitted from the read data register 8 is inverted.

The data bits corrected by the data correcting circuit 17 are transmitted to the CPU on the one hand and are returned to the multiplexer 2 for rewriting into the memory unit 7 on the other. Such a rewriting operation is carried out by the memory write/read control circuit 19, when the circuit 19 receives a single-bit error signal SBE from the error detecting circuit 13.

For a classification of single-bit errors, or double-bit errors, a signal showing the error bit location and the syndrome bits S0 to S7 are transmitted to the error detecting circuit 13, which determines whether correction can be carried out. The result is transmitted to the CPU. Also, when a single-bit error is detected, a corrected codeword is rewritten in the memory unit 7 by the memory write/read control circuit 19, as explained above.

In this embodiment, note that a single-bit error of the check bits in the read data is not corrected in the data correcting circuit 17.

The check bit generating circuit 4 will now be explained with reference to FIG. 5. Each gate of this figure is an exclusive OR circut. The check bit C0 is produced by the modulo-2 sum of the data bits corresponding to the "1" elements of the first row of the H-matrix illustrated in FIG. 1. That is, the check bit C0 is produced by the modulo-2 sum of the data bits D01, D08, D12 to D15, D17, D23, D25, D27, D33, D35, D39 to D46, D50, D52, D57, D58, D61, and D62. Similarly, the check bit C1 is produced by the modulo-2 sum of the data bits corresponding to the "1" elements of the second row of the H-matrix illustrated in FIG. 1. That is, the check bit C1 is produced by the modulo-2 sum of the data bits D02, D03, D06, D08 to D13, D17, D19, D21, D26 to D28, D31, D37, D38, D40, D43, D49, D51, D52, D54, D55, and D60. Also, the check bit C7 is produced by the modulo-2 sum of the data bits corresponding to the "1"elements of the eighth row of the H-matrix illustrated in FIG. 1. That is, the check bit C7 is produced by the modulo-2 sum of the data bits D02, D07, D11, D13, D16, D20, D21, D24, D25, D29 to D32, D35 to D39, D44, D48, D51, D55, D56, D57, D61, and D62.

The syndrome generating circuit 10 will now be explained with reference to FIG. 6. Each gate of this figure is also an exclusive OR circuit. The syndrome bit S0 is produced by the modulo-2 sum of the data bits corresponding to the "1" elements of the first row of the H-matrix illustrated in FIG. 1, including the check bit C0. That is, the syndrome bit S0 is produced by the modulo-2 sum of the data bits D01, D08, D12 to D15, D17, D23, D25, D27, D33, D35, D39 to D46, D50, D52, D57, D58, D61, D62, and the check bit C0. Similarly, the syndrome bit S1 is produced by the modulo-2 sum of the data bits corresponding to the "1" elements of the second row of the H-matrix illustrated in FIG. 1, including the check bit C1. That is, the syndrome bit S1 is produced by the modulo-2 sum of the data bits D02, D03, D06, D08 to D13, D17, D19, D21, D26 to D28, D31, D37, D38, D40, D43, D49, D51, D52, D54, D55, D60, and the check bit C1. Also, the syndrome bit S7 is produced by the modulo-2 sum of the data bits corresponding to the "1" elements of the eighth row of the H-matrix illustrated in FIG. 1, including the check bit C7. That is, the syndrome bit S7 is produced by the modulo-2 sum of the data bits D02, D07, D11, D13, D16, D20, D21, D24, D25, D29 to D32, D35 to D39, D44, D48, D51, D55, D56, D57, D61, D62, and the check bit C7.

If no error is occurred in the read codeword, the syndrome bits S0 to S7 are all "0". That is, the syndrome is the all "0" vector. Contrary to this, if one or more errors are occurred, at least one of the syndrome bits S0 to S7 is "1". That is, the syndrome is not the all "0" vector.

If the first data bit D01 is errorous, then the syndrome bits S0 through S7 are (10100100) which is the first column of the H-matrix illustrated in FIG. 1. That is, the syndrome bits S0 through S7 represent the location of a single-bit error.

Figure 7:
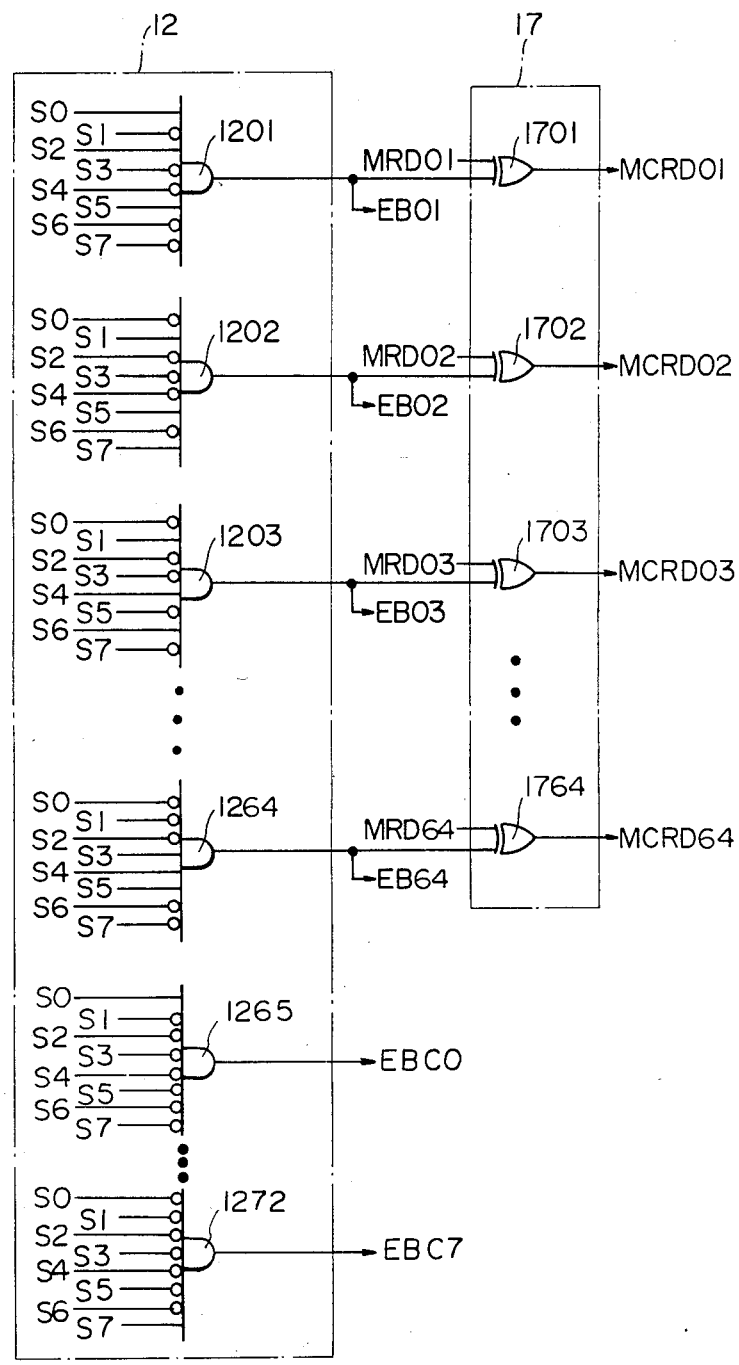
FIG. 7 is a logic circuit diagram of the syndrome decoding circuit and the data correcting circuit of FIG. 4.

The syndrome decoding circuit 12 and the data correcting circuit 17 will now be explained with reference to FIG. 7. In FIG. 7, the syndrome decoding circuit 12 includes eight-input gate circuits 1201 through 1272 which correspond to the data bits D01 through D64 and the check bits C0 through C7. Each of the eight-input gate circuits serves as a decoder. Note that such a check bit error is corrected by the reproduction of check bits when a rewriting operation for a single-bit error of the data bits is carried out.

The data correcting circuit 17 includes 64 exclusive OR circuits 1701 through 1764, which correspond to the 64 data bits. If the syndrome bits S0 to S7 (10100100) are applied to the syndrome decoding circuit 12, the gate circuit 1201 of the syndrome decoding circuit 12 generates an error bit signal EB01 showing that the location of an error bit is the first column corresponding to the data bit D01, so as to invert the data MRD01 from the read data register 8, thereby carrying out a correcting operation. Thus, corrected data MCRD01 is produced. Such corrected data MCRD01 is rewritten into the memory unit 7 by the memory write/read control circuit 19, which will be explained in detail later.

Figure 8:
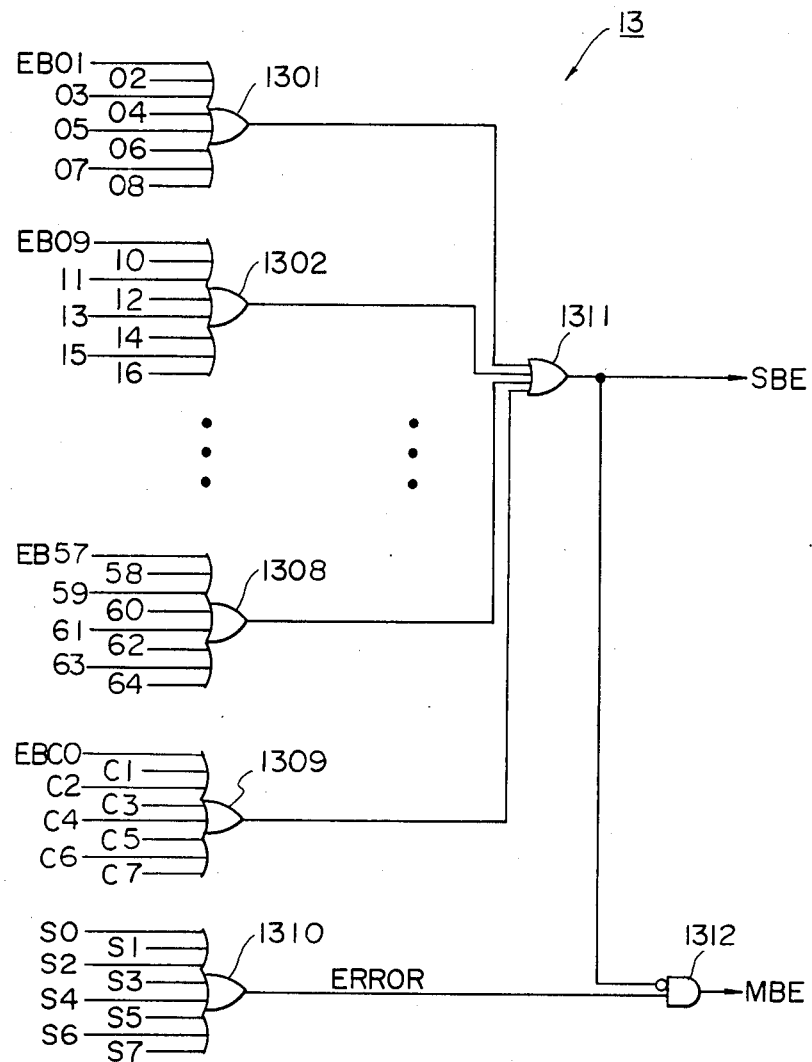
FIG. 8 is a logic circuit diagram of the error detecting circuit of FIG. 4.

The error detecting circuit 13 will now be explained with reference to FIG. 8. In FIG. 8, reference numeral 1301 through 1310 designate eight-input OR circuits, 1311 a nine-input OR circuit, and 1312 a two-input gate circuit, SBE a single-bit error signal, and MBE a multiple-bit error signal.

When a single-bit error is occurred, only one of the error bit signals EB01 to EB64 and EBC0 to EBC7 becomes high. As a result, only one of the OR circuits 1301 to 1309 generates a high level signal, and, accordingly, the OR circuit 1311 generates the single-bit error signal SBE, while the gate circurt 1312 does not generate a multiple-bit error signal MBE.

When a special multiple-bit error is generated, the OR circuit 1311 does not generate a single-bit error singnal SBE, while the gate circuit 1312 generates a multiple-bit error signal MBE. Such a special multiple-bit error will be explained now.

If two data bits such as D01 and D02 are simultaneously erroneous, the syndrome bits S0 to S7 are (11100001). That is, the syndrome is an even-weight vector. In addition, since such two data bits are different from each other, the syndrome is not the all "0" vector. Therefore, the syndrome does not coincide with any column vectors of the H-matrix, which column vectors are odd-weight vectors. As a result, this syndrome cannot be decoded by any gate citcuits 1201 through 1272 of the syndrome decoding circuit 12, so that all the error bit signals EB01 through EB64 and EBC0 through EBC7 are at a low level. Thus, the single-bit error signal SBE is at a low level. Contrary to this, since the syndrome is not the all "0" vector, the OR circuit 1310 generates a signal ERROR, and, accordingly, the gate circuit 1312 generates the multiple-bit error signal MBE at a high level. Thus, a double-bit error is detected.

If three date bits within one block such as D01, D02, and D03 are simultaneously erroneous, the syndrome bits S0 to S7 are (10101011). That is, the syndrome is an odd-weight vector. In this case, however, according to the above-mentioned condition (V), this syndrome does not coincide with any column vectors of the H-matrix. As a result, this syndrome cannot be decoded by any gate circuits 1201 through 1272 of the syndrome decoding circuit 12, so that all the error bit signals EB01 through EB64 and EBC0 through EBC7 are at a low level. Thus, the single-bit error signal SBE is at a low level. Contrary to this, since the syndrome is not the all "0" vector, the OR circuit 1310 generates a signal ERROR, and, acccordingly, the gate circuit 1312 generates the multiple-bit error signal MBE at a high level. Thus, a triple-bit error within one block is detected.

If four data bits within one block such as D01, D02, D03, and D04 are simultaneously erroneous, the syndrome bits S0 to S7 are (10011001). That is, the syndrome is an even-weight vector. In addition, according to the above-mentioned condition (Vi), the syndrome is not the all "0" vector. Therefore, the syndrome does not coincide with any column vectors of the H-matrix, which column vectors are odd-weight vectors. As a result, this syndrome also cannot be decoded by any gate circuits 1201 through 1272 of the syndrome decoding circuit 12, so that all the error bit signals EB01 through EB64 and EBC0 through EBC7 are at a low level. Thus, the single-bit error signal SBE is at a low level. Contrary to this, since the syndrome is not the all "0" vector, the OR circuit 1310 generates a signal ERROR, and, accordingly, the gate circuit 1312 generates the multiple-bit error signal MBE at a high level. Thus, a four-bit error within one block is detected.

If eight data bits such as D01 to D04 and C1, D62 to D64 within two blocks are simultaneously erroneous, the syndome bits S0 to S7 are (01101010). That is, the syndrome is an even-weight vector. In addition, according to the above-mentioned condition (Vii), the syndrome is not the all "0" vector. Therefore, the syndrome does not coincide with any column vectors of the H-matrix, which column vectors are odd-weight vectors. As a result, this syndrome also cannot be decoded by any gate citcuits 1201 through 1272 of the syndrome decoding circuit 12, so that all the error bit signals EB01 through EB64 and EBC0 through EBC7 are at a low level. Thus, the single-bit error signal SBE is at a low level. Contrary to this, since the syndrome is not the all "0" vector, the OR circuit 1310 generates a signal ERROR, and, accordingly, the gate circuit 1312 generates the multiple-bit error signal MBE at a high level. Thus, an 8-bit burst error within two block is detected.

Thus, it is possible to correct a single-bit error and to detect a double-bit error, a triple-bit error within one block, and a quadruple-bit error within one block having 4 bits. It is also possible to detect an 8-bit burst error within two blocks.

Figure 9:
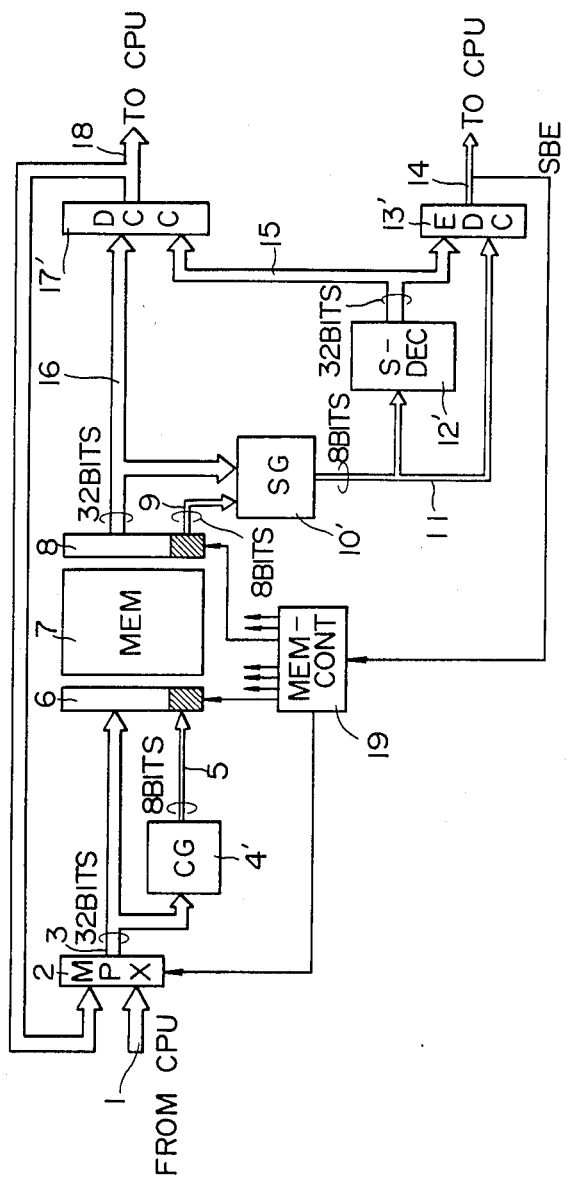
FIG. 9 is a block diagram of a second embodiment of the error correcting and detecting system according to the present invention.

In FIG. 9, which is a second embodiment of the present invention using the H-matrix of FIG. 2, the same elements as those of FIG. 4 are denoted by the same references. In FIG. 9, the write data line 3, the decoding line 15, the read data line 16, and the corrected memory read data line 18 are of a 32-bit configuration. Also the check bit line 5, the read check bit line 9, and the syndrome line 11 are of an 8-bit configuration. Therefore, the check bit generating circuit 4', the syndrome generating circuit 12', the error detecting circuit 13', and the data correcting circuit 17' are a little different from the corresponding elements of FIG. 4.

Figure 10:
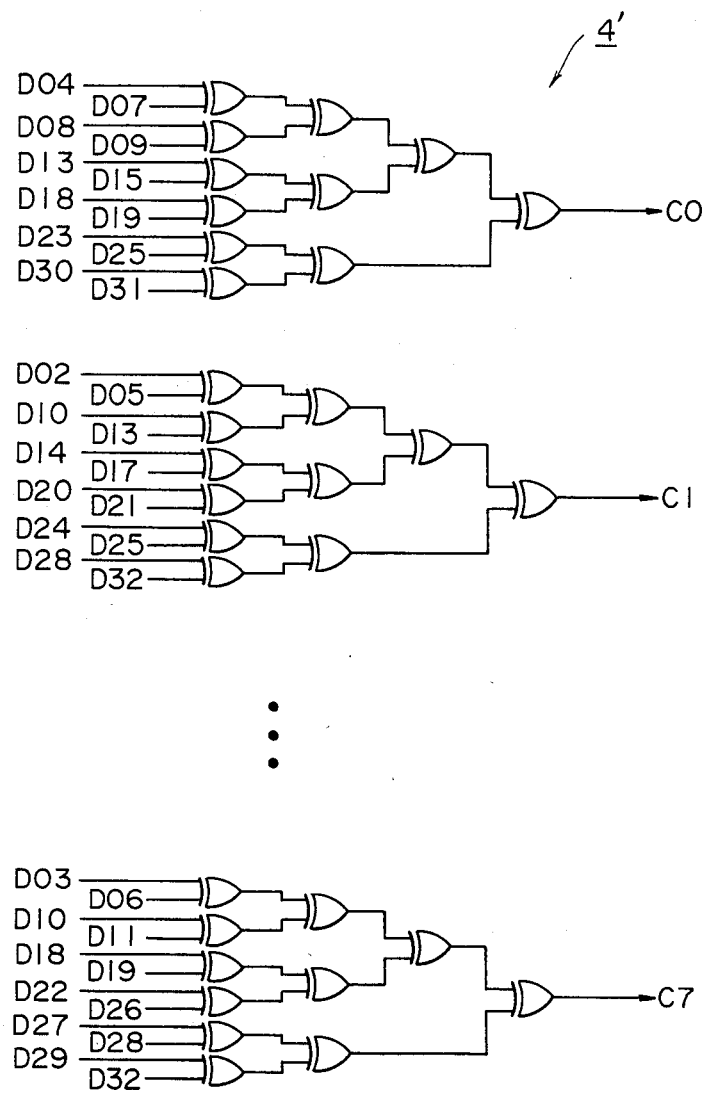
FIG. 10 is a logic circuit diagram of the check bit generating circuit of FIG. 9.

The check bit generating circuit 4' will now be explained with reference to FIG. 10. Each gate of this figure is an exclusive OR circut. The check bit C0 is produced by the modulo-2 sum of the data bits corresponding to the "1" elements of the first row of the H-matrix illustrated in FIG. 2. That is, the check bit C0 is produced by the modulo-2 sum of the data bits D04, D07 to D09, D13, D15, D18, D19, D23, D25, D30, and D31. Similarly, the check bit C1 is produced by the modulo-2 sum of the data bits corresponding to the "1" elements of the second row of the H-matrix illustrated in FIG. 2. That is, the check bit C1 is produced by the modulo-2 sum of the data bits D02, D05, D10, D13, D14, D17, D20, D21, D24, D25, D28, and D32. Also, the check bit C7 is produced by the modulo-2 sum of the data bits corresponding to the "1" elements of the eighth row of the H-matrix illustrated in FIG. 2. That is, the check bit C7 is produced by the modulo-2 sum of the data bits D03, D06, D10, D11, D18, D19, D22, D26 to D29, and D32.

Figure 11:
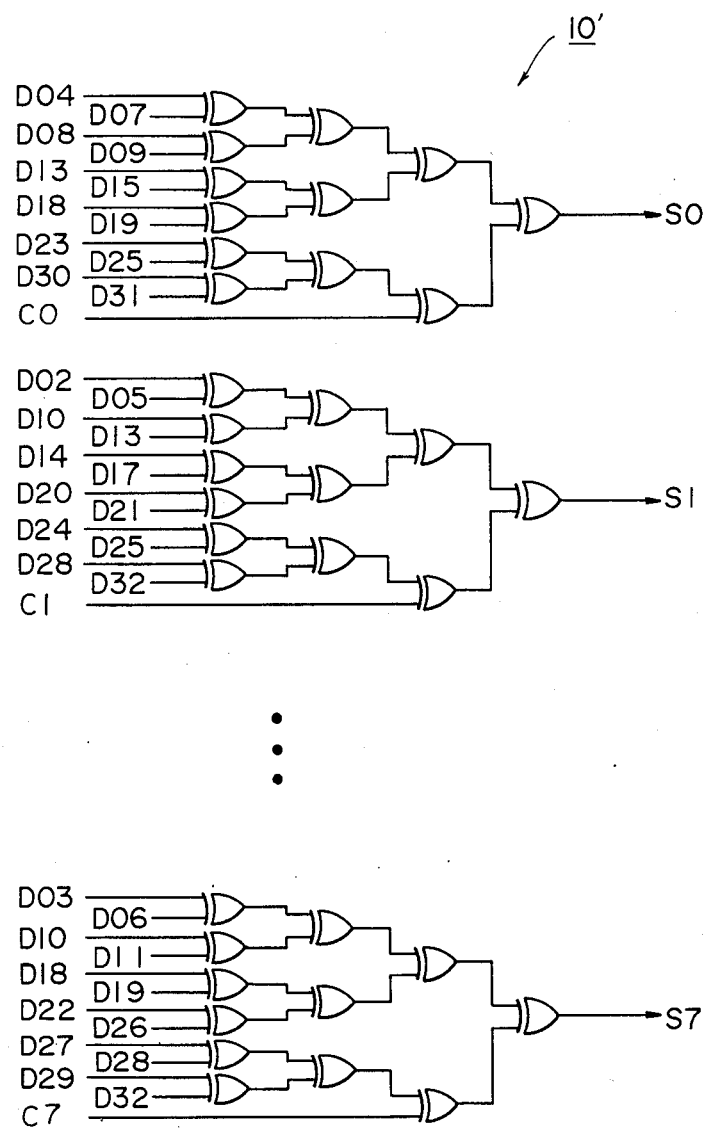
FIG. 11 is a logic circuit diagram of the syndrome generating circuit of FIG. 9.

The syndrome generating circuit 10' will now be explained with reference to FIG. 11. Each gate of this figure is also an exclusive OR circuit. The syndrome bit S0 is produced by the modulo-2 sum of the data bits corresponding to the "1" elements of the first row of the H-matrix illustrated in FIG. 2. That is, the syndrome bit S0 is produced by the modulo-2 sum of the data bits D04, D07 to D09, D13, D15, D18, D19, D23, D25, D30, and D31, and the check bit C0. Similarly, the the syndrome bit S1 is produced by the modulo-2 sum of the data bits corresponding to the "1" elements of the second row of the H-matrix illustrated in FIG. 2. That is, the syndrome bit S1 is produced by the modulo-2 sum of the data bits D02, D05, D10, D13, D14, D17, D20, D21, D24, D25, D28, and D32, and the check bit C1. Also, the syndrome bit S7 is produced by the modulo-2 sum of the data bits corresponding to the "1" elements of the eighth row of the H-matrix illustrated in FIG. 2. That is, the syndrome bit S7 is produced by the modulo-2 sum of the data bits D03, D06, D10, D11, D18, D19, D22, D26 to D29, and D32, and the check bit C7.

If no error is occurred in the read codeword, the syndrome bits S0 to S7 are all "0". That is, the syndrome is the all "0" vector. Contrary to this, if one or more errors are occurred, at least one of the syndrome bits S0 to S7 is "1". That is, the syndrome is not the all "0" vector.

If the first data bit D01 is errorous, then the syndrome bits S0 through S7 are (00100110) which is the first column of the H-matrix illustrated in FIG. 2. That is, the syndrome bits S0 through S7 represent the location of a single-bit error.

Figure 12:
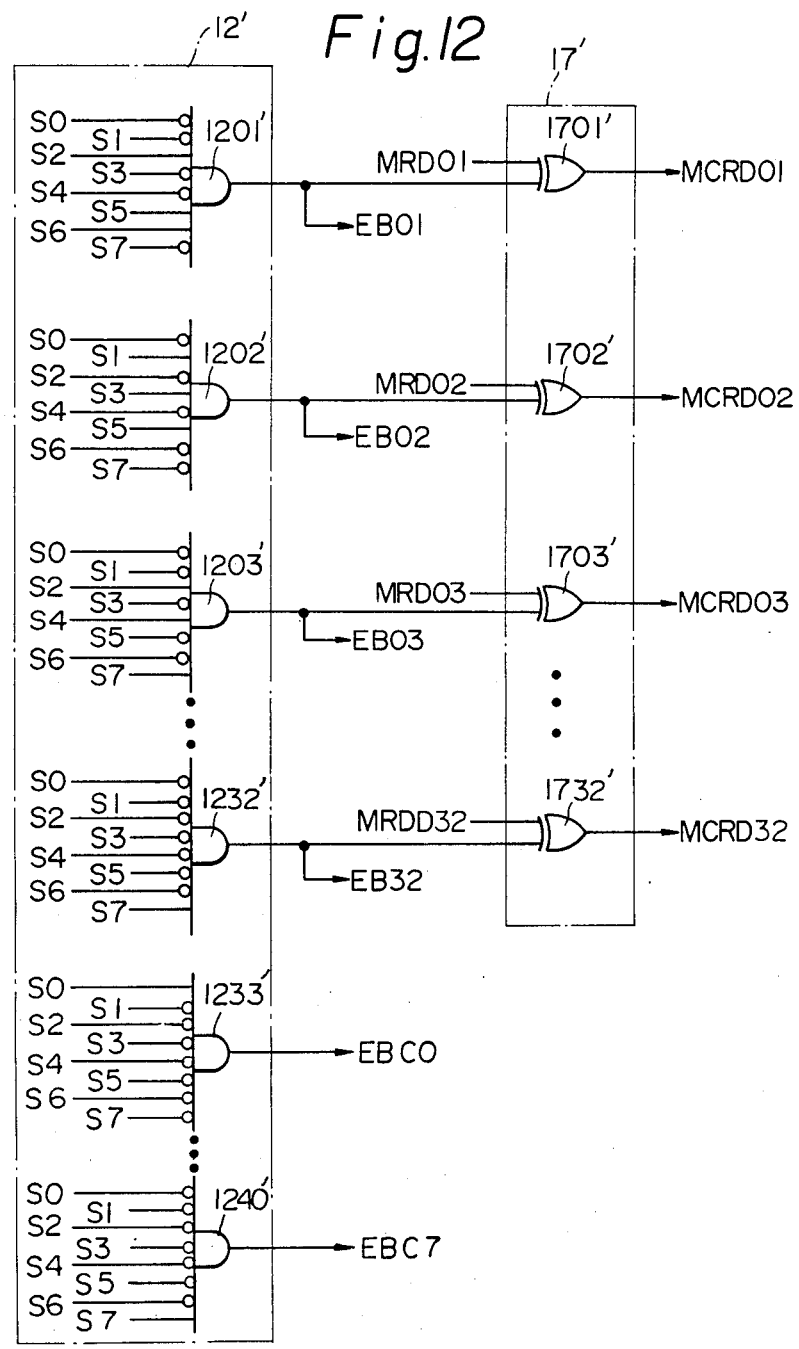
FIG. 12 is a logic circuit diagram of the syndrome decoding circuit and the data correcting circuit of FIG. 9.

The syndrome decoding circuit 12' and the data correcting circuit 17' will now be explained with reference to FIG. 12. In FIG. 12, the syndrome decoding circuit 12' includes eight-input gate circuits 1201' through 12'', which correspond to the data bits D01 through D32 and check bits C0 through C7. Each of the eight-input gate circuits serves as a decoder. The data correcting circuit 17' includes 32 exclusive OR circuits 1701' through 1732' which also correspond to the 32 data bits D01 to D32. If the syndrome bits S0 to S7 (00100110) are applied to the syndrome decoding circuit 12', the gate circuit 1201' of the syndrome decoding circuit 12' generates an error bit signal EB01 showing that the location of an error bit is the first column corresponding to the data bit D01, so as to invert the data MRD01 from the read data register 8, thereby carrying out a correcting operation. Thus, corrected data MCRD01 is produced. Such corrected data MCRD01 is rewritten into the memory unit 7 by the memory write/read control circuit 19.

Figure 13:
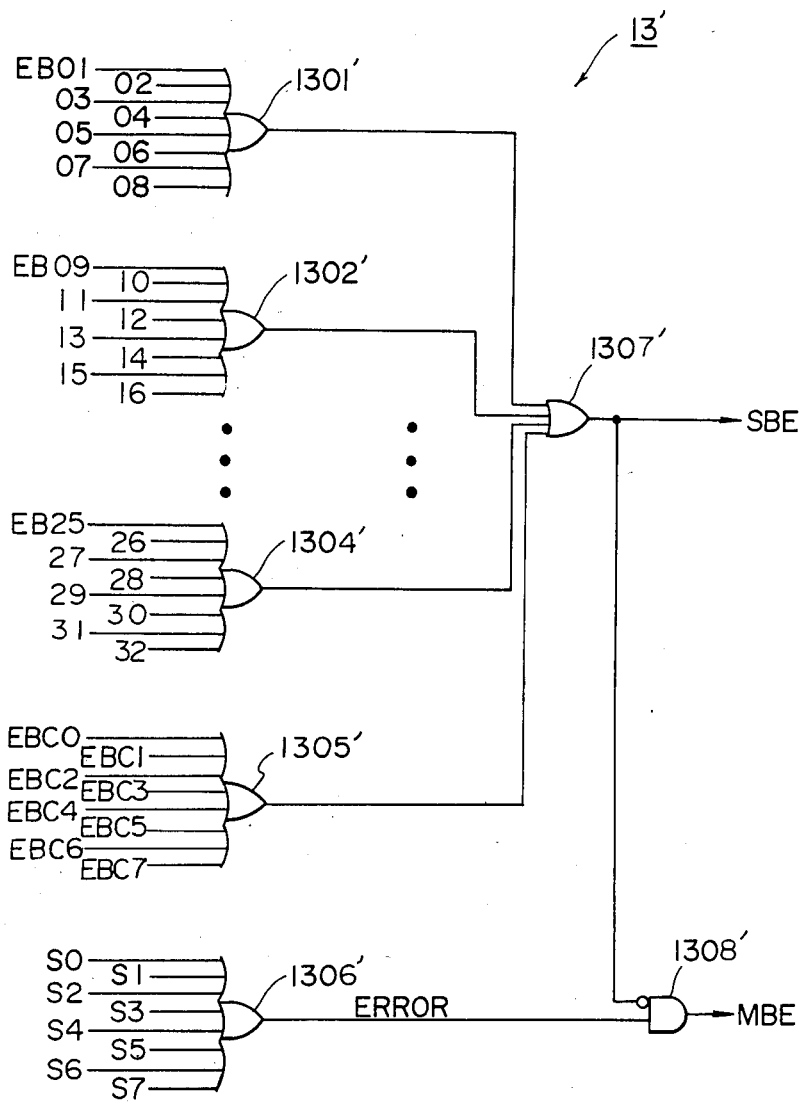
FIG. 13 is a logic circuit diagram of the error detecting circuit of FIG. 9.

The error detecting circuit 13' will now be explained with reference to FIG. 13. In FIG. 13, reference numerals 1301' through 1306' designate eight-input OR circuits, 1307' a five-input gate circuit, 1308' a two-input gate circuit, SBE a single-bit error signal, and MBE a multiple-bit error signal.

When a signal-bit error is occurred, only one of the error bit signals EB01 to EB32 and EBC0 to EBC7 becomes high. As a result, only one of the OR circuit 1301' to 1305' generates a high level signal, and accordingly, the OR circuit 1307' generates the single-bit error signal SBE, while the gate circuit 1308' does not generate a multiple-bit error signal MBE.

When a special multiple-bit error is generated, the OR circuit 1307' does not generate a single-bit error signal SBE, while the gate circuit 1308' generates the multiple-bit error signal MBE.

Such a special multiple bit error will now be explained. If two data bits such as D01 and D02 are simultaneously erroneous, the syndrome bits S0 to S7 are (01110010). That is, the syndrome is an even-weight vector. In addition, since such two data bits are different from each other the syndrome is not the all "0" vector. Therefore, the syndrome does not coincide with any column vectors of the H-matrix, which column vectors are odd-weight vectors. As a result, this syndrome cannot be decoded by any gate circuits 1201' through 1240' of the syndrome decoding circuit 12', so that all the error bit signals EB01 through EB32 and EBC0 through EBC7 are at a low level. Thus, the single-bit error signal SBE is at a low level. Contrary to this, since the syndrome is not the all "0" vector, the OR circuit 1306' generates a signal ERROR, and, accordingly, the gate circuit 1308' generates the multiple-bit error signal MBE at a high level. Thus, a double-bit error is detected.

If three data bits within one block such as D01, D02, and D03 are simultaneously erroneous, the syndrome bits S0 to S7 are (01011011). That is, the syndrome is an odd-weight vector. In this case, however, according to the above-mentioned condition (V), this syndrome does not coincide with any column vectors of the H-matrix. As a result, this syndrome cannot be decoded by any gate circuits 1201' through 1240' of the syndrome decoding circuit 12', so that all the error bit signals EB01 through EB32 and EBC0 through EBC7 are at a low level. Thus, the single-bit error signal SBE is at a low level. Contrary to this, since the syndrome is not the all "0" vector, the OR circuit 1306' generates a signal ERROR, and, accordingly, the gate circuit 1308' generates the multiple-bit error signal MBE at a high level. Thus, a triple-bit error within one block is detected.

If four data bits within one block such as D01, D02, D03, and D04 are simultaneously erroneous, the syndrome bits S0 to S7 are (11010001). That is, the syndrome is an even-weight vector. In addition, according to the above-mentioned condition (vi), the syndrome is not the all "0" vector. Therefore, the syndrome does not coincide with any column vectors of the H-matrix, which column vectors are odd-weight vectors. As a result, this syndrome also cannot be decoded by any gate circuits 1201' through 1240' of the syndrome decoding circuit 12', so that all the error bit signals EB01 through EB32 and EBC0 through EBC7 are at a low level. Thus, the single-bit error signal SBE is at a low level. Contrary to this, since the syndrome is not the all "0" vector, the OR circuit 1305' generates a signal ERROR, and, accordingly, the gate circuit 1307' generates the multiple-bit error signal MBE at a high level. Thus, a four-bit error within one block is detected.

If eight data bits such as D01 to D08 within two arbitrary blocks are simultaneously erroneous, the syndrome bits S0 to S7 are (10011100). That is, the syndrome is an even-weight vector. In addition, according to the above-mentioned condition (vii), the syndrome is not the all "0" vector. Therefore, the syndrome does not coincide with any column vectors of the H-matrix, which column vectors are odd-weight vectors. As a result, this syndrome also cannot be decoded by any gate circuits 1201' through 1240' of the syndrome decoding circuit 12', so that all the error bit signals EB01 through EB32 and EBC0 through EBC7 are at a low level. Thus, the single-bit error signal SBE is at a low level. Contrary to this, since the syndrome is not the all "0" vector, the OR circuit 1306' generates a signal ERROR, and, accordingly, the gate circuit 1308' generates the multiple-bit error signal MBE at a high level. Thus, an eight-bit burst error within two blocks is detected.

Thus, it is possible to correct a single-bit error and to detect a double-bit error, a triple-bit error within one block, and a quadruple-bit error within one block having 4 bits. It is also possible to detect an 8-bit burst error within two blocks.

Figure 14:
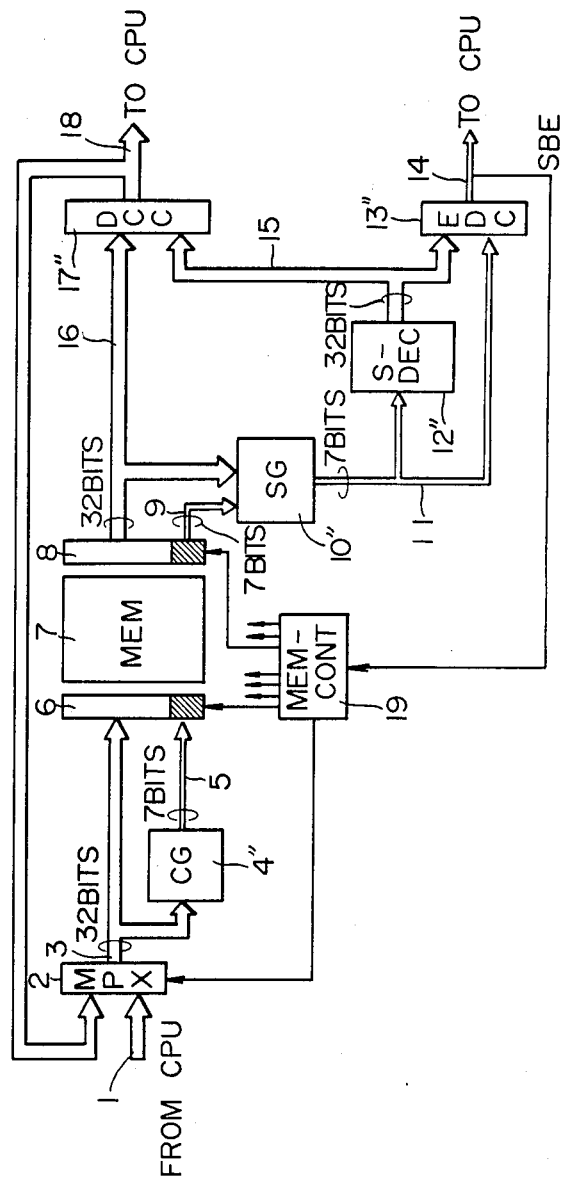
FIG. 14 is a block diagram of a third embodiment of the error correcting and detecting system according to the present invention.

In FIG. 14, which is a third embodiment of the present invention using the H-matrix of FIG. 3, the same elements as those of FIG. 4 are denoted by the same references. In FIG. 14, the write data line 3, the decoding line 15, the read data line 16, and the corrected memory read data line 18 are of a 32-bit configuration. Also the check bit line 5, the read check bit line 9, and the syndrome line 11 are of a 7-bit configuration. Therefore, the check bit generating circuit 4'', the syndrome generating circuit 12'', the error detecting circuit 13'', and the data correcting circuit 17'' are a little different from the corresponding elements of FIG. 4.

Figure 15:
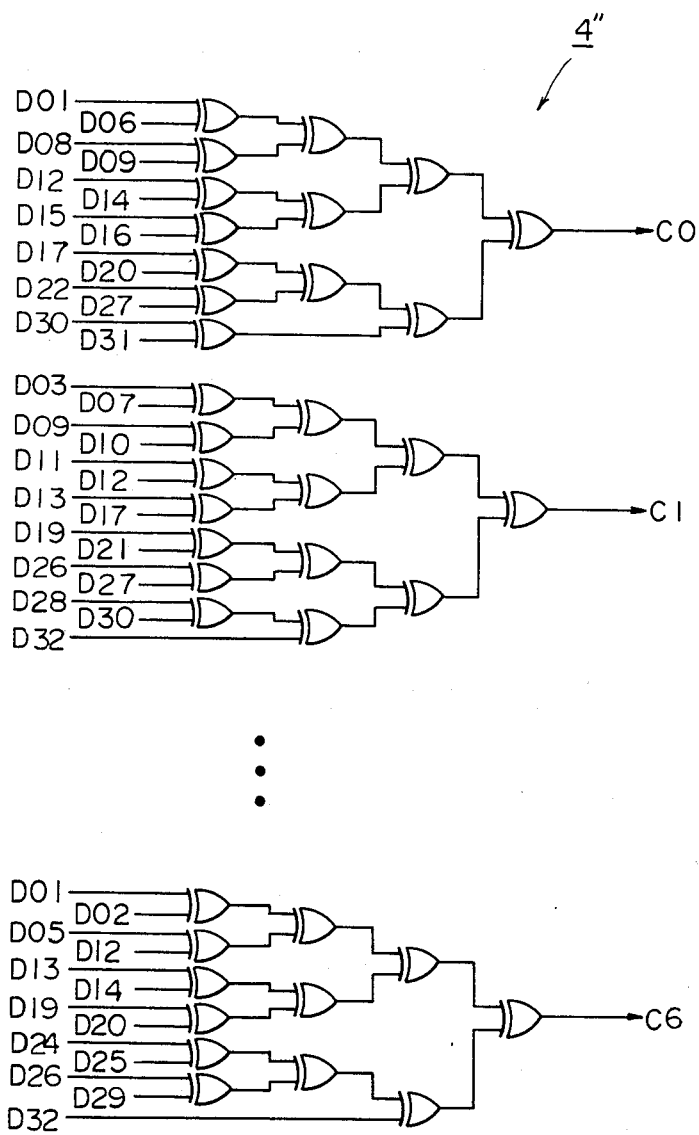
FIG. 15 is a logic circuit diagram of the check bit generating circuit of FIG. 14.

The check bit generating circuit 4'' will now be explained with reference to FIG. 15. Each gate of this figure is an exclusive OR circuit. The check bit C0 is produced by the modulo-2 sum of the data bits corresponding to the "1" elements of the first row of the H-matrix illustrated in FIG. 3. That is, the check bit C0 is produced by the modulo-2 sum of the data bits D01, D06, D08, D09, D12, D14 to D17, D20, D22, D27, D30, and D31. Similarly, the check bit C1 is produced by the modulo-2 sum of the data bits corresponding to the "1" elements of the second row of the H-matrix illustrated in FIG. 3. That is, the check bit C1 is produced by the modulo-2 sum of the data bits D03, D07, D09 to D13, D17, D19, D21, D26 to D28, D30, and D32. Also, the check bit C6 is produced by the modulo-2 sum of the data bits corresponding to the "1" elements of the seventh row of the H-matrix illustrated in FIG. 3. That is, the check bit C6 is produced by the modulo-2 sum of the data bits D01, D02, D05, D12 to D14, D19, D20, D24, D25, D26, D29, and D32.

Figure 16:
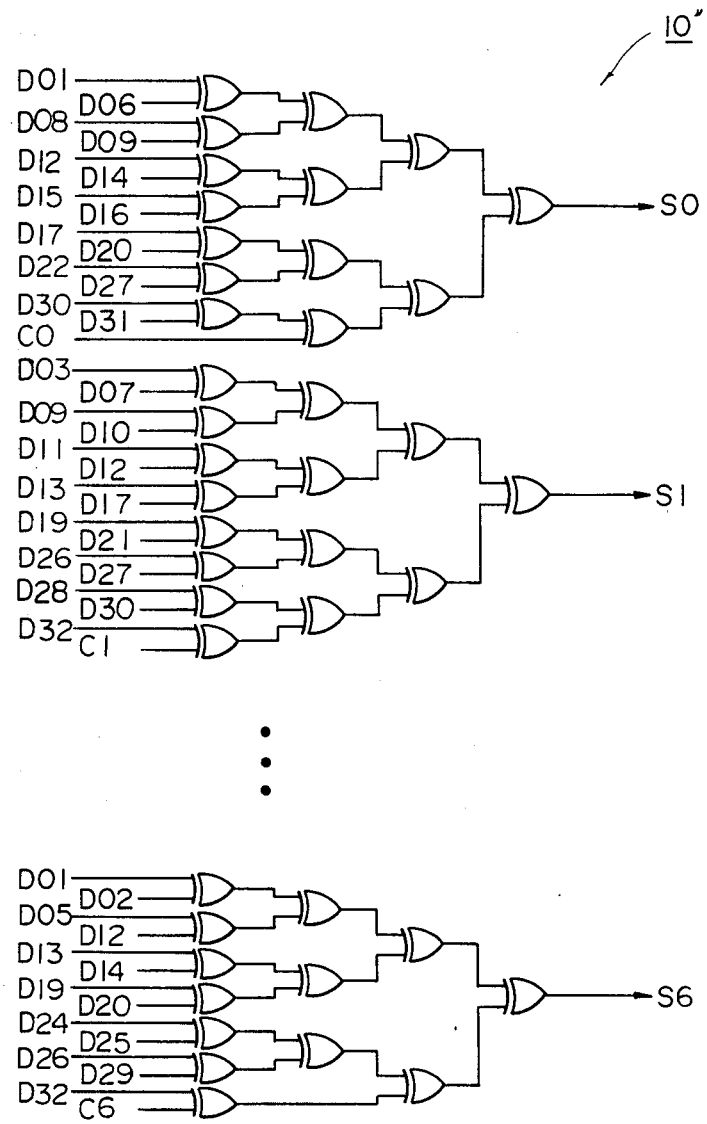
FIG. 16 is a logic circuit diagram of the syndrome generating circuit of FIG. 14.

The syndrome generating circuit 10" will now be explained with reference to FIG. 16. Each gate of this figure is also an exclusive OR circuit. The syndrome bit S0 is produced by the modulo-2 sum of the data bits corresponding to the "1" elements of the first row of the H-matrix illustrated in FIG. 3, including the check bit C0. That is, the syndrome bit S0 is produced by the the modulo-2 sum of the data bits D01, D06, D08, D09, D12, D14 to D17, D20, D22, D27, D30, and D31, and the check bit C0. Similarly, the syndrome bit S1 is produced by the modulo-2 sum of the data bits corresponding to the "1" elements of the second row of the H-matrix illustrated in FIG. 3, including the check bit C1. That is, the syndrome bit S1 is produced by the modulo-2 sum of the data bits D03, D07, D09 to D13, D17, D19, D21, D26 to D28, D30, and D32, and the check bit C1. Also, the syndrome bit S6 is produced by the modulo-2 sum of the data bits corresponding to the "1" elements of the seventh row of the H-matrix illustrated in FIG. 3, including the check bit C6. That is, the syndrome bit S6 is produced by the modulo-2 sum of the data bits D01, D02, D05, D12 to D14, D19, D20, D24, D25, D26, D29, and D32, and the check bit C6.

If no error is occurred in the read codeword, the syndrome bits S0 to S6 are all "0". That is, the syndrome is the all "0" vector. Contrary to this, if one or more error bits are occurred, at least one of the syndrome bits S0 to S6 is "1". That is, the syndrome is not the all "0" vector.

If the first data bit D01 is erroneous, then the syndrome bits S0 through S6 are (1000011), which is the first column of the H-matrix illustrated in FIG. 3. That is, the syndrome bits S0 through S6 represent the location of a single-bit error.

Figure 17:
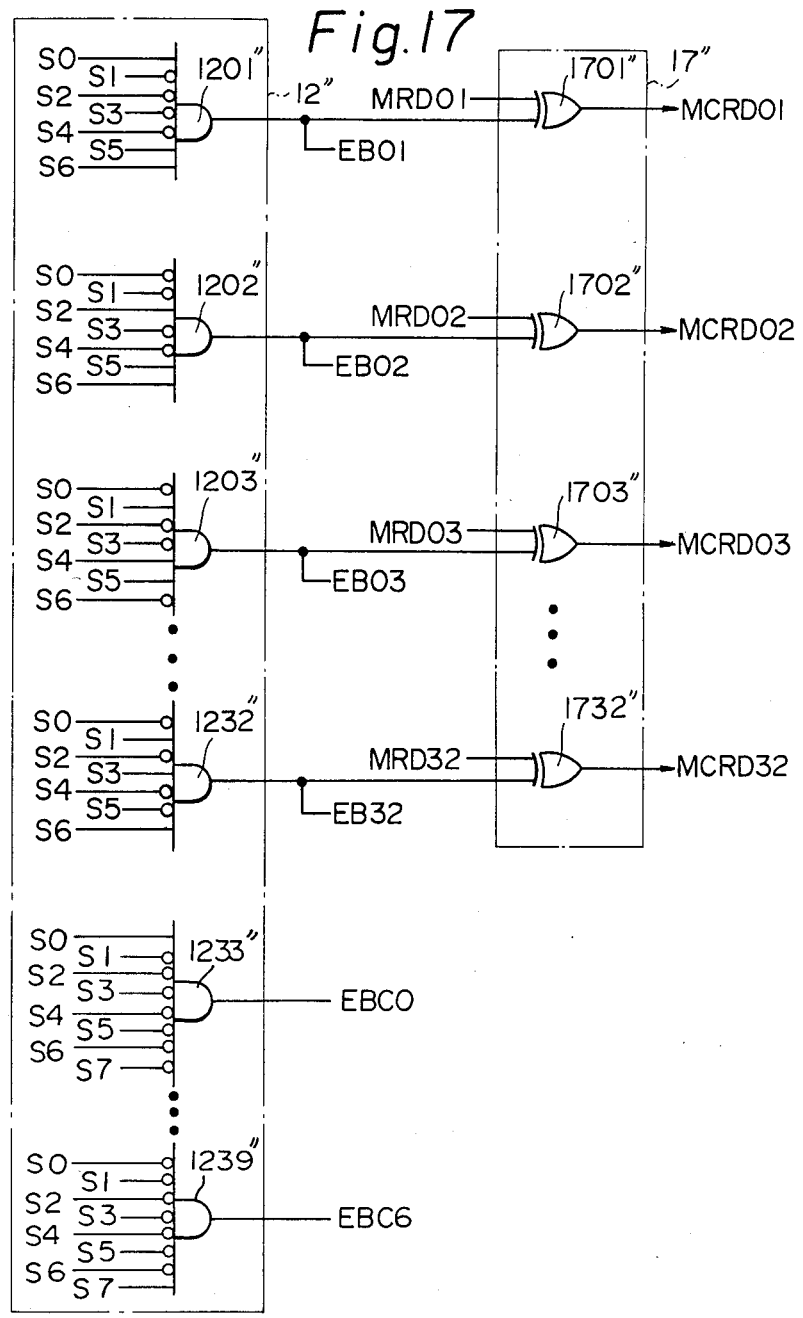
FIG. 17 is a logic circuit diagram of the syndrome decoding circuit and the data correcting circuit of FIG. 14.

The syndrome decoding circuit 12" and the data correcting circuit 17" will now be explained with reference to FIG. 17. In FIG. 17, the syndrome decoding circuit 12" includes seven-input gate circuits 1201" through 1239", which correspond to the data bits D01 through D39 and the check bits C0 through C6. Each of the seven-input gate circuits serves as a decoder. The data correcting circuit 17" includes 32 exclusive OR circuits 1701" through 1732", which correspond to the 32 data bits. If the syndrome bits S0 to S6 (1000011) are applied to the syndrome decoding circuit 12", the gate circuit 1201" of the syndrome decoding circuit 12" generates an error bit signal EB01 showing that the location of a bit error is the first column corresponding to the data bit D01, so as to invert the data MRD01 from the read data register 8, thereby carrying out a correcting operation. Thus, corrected data MCRD01 is produced. Such corrected data MCRD01 is rewritten into the memory unit 7 by the memory write/read control circuit 19.

Figure 18:
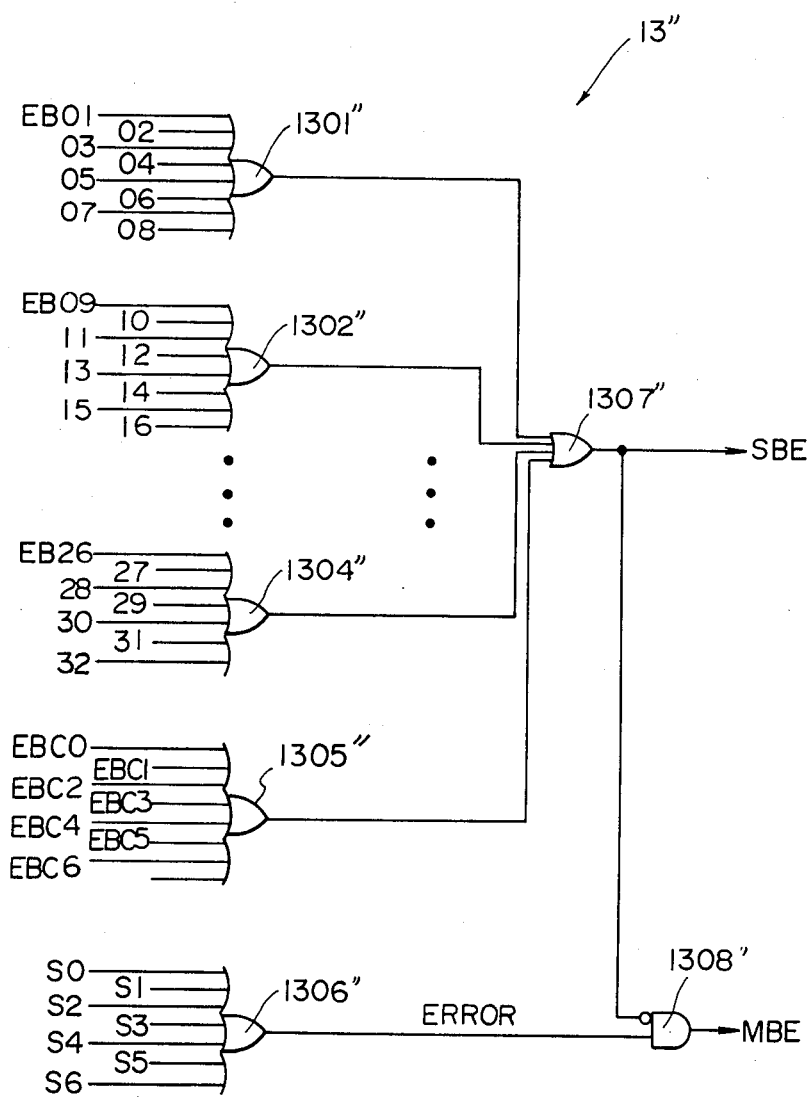
FIG. 18 is a logic circuit diagram of the error detecting circuit of FIG. 14.

The error detecting circuit 13" will now be explained with reference to FIG. 18. In FIG. 18, reference numerals 1301" through 1306" designate seven-input OR circuits, 1307" a five-input OR circuit, 1308" a two-input gate circuit, SBE a single-bit error signal, and MBE a multiple-bit error signal.

When a single-bit error is occurred, only one of the error bit signals EB01 to EB32 and EBC0 to EBC6 becomes high. As a result, only one of the OR circuits 1301" to 1305" generates a high level signal, and, accordingly, the OR circuit 1307" generates the single-bit error signal SBE, while the gate circuit 1308" does not generate a multiple-bit error signal MBE.

When a special multiple-bit error is generated, the OR circuit 1307" does not generate a single-bit error signal SBE, while the gate circuit 1308" generates the multiple-bit error signal MBE.

Such a special multiple bit error will be explained. If two data bits such as D01 and D02 are simultaneously erroneous, the syndrome bits S0 to S6 are (1010000). That is, the syndrome is an even-weight vector. In addition, since such two data bits are different from each other, the syndrome is not the all "0" vector. Therefore, the syndrome does not coincide with any column vectors of the H-matrix, which column vectors are odd-weight vectors. As a result, this syndrome cannot be decoded by any gate circuits 1201" through 1239" of the syndrome decoding circuit 12, so that all the error bit signals EB01 through EB32 and EBC0 through EBC6 are at a low level. Thus, the single-bit error signal SBE is at a low level. Contrary to this, since the syndrome is not the all "0" vector, the OR circuit 1306" generates a signal ERROR, and, accordingly, the gate circuit 1308" generates the multiple-bit error signal MBE at a high level. Thus, a double-bit error is detected.

If three data bits within one block such as D01, D02, and D03 are simultaneously erroneous, the syndrome bits S0 to S6 are (1110110). That is, the syndrome is an odd-weight vector. In this case, however, according to the above-mentioned condition (V), this syndrome does not coincide with any column vectors of the H-matrix. As a result, this syndrome cannot be decoded by any gate circuits 1201" through 1239" of the syndrome decoding circuit 12", so that all the error bit signals EB01 through EB32 and EBC0 through EBC6 are at a low level. Thus, the single-bit error signal SBE is at a low level. Contrary to this, since the syndrome is not the all "0" vector, the OR circuit 1306" generates a signal ERROR, and, accordingly, the gate circuit 1308" generates the multiple-bit error signal MBE at a high level. Thus, a triple-bit error within one block is detected.

If four data bits within one block such as D01, D02, D03, and D04 are simultaneously erroneous, the syndrome bits S0 to S6 are (1111000). That is, the syndrome is an even-weight vector. In addition, according to the above-mentioned condition (vi), the syndrome is not the all "0" vector. Therefore, the syndrome does not coincide with any column vectors of the H-matrix, which column vectors are odd-weight vectors. As a result, this syndrome also cannot be decoded by any gate circuits 1201" through 1239" of the syndrome decoding circuit 12", so that all the error bit signals EB01 through EB32 and EBC0 through EBC6 are at a low level. Thus, the single-bit error signal SBE is at a low level. Contrary to this, since the syndrome is not the all "0" vector, the OR circuit 1306" generates a signal ERROR, and, accordingly, the gate circuit 1308" generates the multiple-bit error signal MBE at a high level. Thus, a four-bit error within one block is detected.

If eight data bits such as D01 to D04 and D10 to D13 within two arbitrary blocks are simultaneously erroneous, the syndrome bits S0 to S6 are (0100100). That is, the syndrome is an even-weight vector. In addition, according to the above-mentioned condition (vii), the syndrome is not the all "0" vector. Therefore, the syndrome does not coincide with any column vectors of the H-matrix, which column vectors are odd-weight vectors. As a result, this syndrome also cannot be decoded by any gate circuits 1201″ through 1239″ of the syndrome decoding circuit 12″, so that all the error bit signals EB01 through EB32 and EBC0 through EBC6 are at a low level. Thus, the single-bit error signal SBE is at a low level. Contrary to this, since the syndrome is not the all "0" vector, the OR circuit 1306″ generates a signal ERROR, and, accordingly, the gate circuit 1308″ generates the multiple-bit error signal MBE at a high level. Thus, an 8-bit burst error within two blocks is detected.

Thus, it is possible to correct a single-bit error and to detect a double-bit error, a triple-bit error within one block, and a quadruple-bit error within one block having 4 bits. It is also possible to detect an 8-bit burst error within two blocks.

According to the error correcting and detecting system of the present invention, it is possible to detect an 8-bit burst error within two blocks, which is impossible in the prior art, without increasing the check bits (redundancy bits) as compared with the prior art, thereby further enhancing the error detecting ability.

In a memory unit formed by memory chips of a 4-bit configuration, since the presence of an 8-bit burst error due to the failure of two chips or the failure of a common circuit for the two chips can be detected in accordance with the present invention, the data integrity of the memory unit and the reliability of the hardware are improved. Further, even in the case where the memory unit is constructed by memory modules of an 8-bit configuration using memory chips of a 1-bit configuration, of a 2-bit configuration or of a 4-bit configuration, since a burst error within the memory module or an 8-bit burst error of two of the memory modules can be detected, the present invention is helpful in securing integrity of data and improving the reliability.

The error correcting and detecting system of the present invention can be realized by the same amount of hardware, the same time of coding and decoding, the same reliability, and the same cost as those of the prior art technology. Further, when improving the cost performance by replacing the memory chip with a move highly integrated memory chip, for example, when replacing a 64K bit memory chip of a 64K word×1 bit configuration with a 256K bit memory chip of the 250K word×1 bit configuration, the same error correcting and detecting system using the prior art SEC-DED code can be used. However, there is a problem in that the minimum and incremental capacity of the memory unit are increased and the performance of the replaced memory unit is reduced since the interleaves per unit capacity are decreased.

On the other hand, when the above-mentioned memory unit is replaced with a 256K bit memory chip of a 64K word×4 bit configuration, the same minimum and incremental capacity of the memory unit is obtained as the predecessor. However, the prior art error correcting and detecting system using the SEC-DED code cannot be used in view of integrity of and reliability of data. In such a case, if the error correcting and detecting system of the present invention is used, it is unnecessary to modify the configuration and timing specification of the error correcting and detecting system on the replacement, thereby obtaining the advantage of sufficient data integrity and reliability.

We claim:

1. A error correcting and detecting system comprising means (4) for producing 8 redundancy bits from 64 data bits in accordance with the following parity-check H-matrix (100) formed by 18 vector blocks, each vector block comprising 4 column vectors $$\begin{pmatrix} i^h1j \\ i^h2j \\ i^h3j \\ \cdot \\ \cdot \\ \cdot \\ i^h8j \end{pmatrix}$$

where each element is 0 or 1;

$$i = 1, 2, \ldots, 18; \text{ and } j = 1, 2, 3, 4; \text{ then}$$

$$H = \qquad (100)$$

$$\begin{pmatrix} \overbrace{1^h11\ 1^h12\ 1^h13\ 1^h14}^{\text{BLOCK 1}} & \overbrace{2^h11\ 2^h12\ 2^h13\ 2^h14}^{\text{BLOCK 2}} & \overbrace{18^h11\ 18^h12\ 18^h13\ 18^h14}^{\text{BLOCK 18}} \\ 1^h21\ 1^h22\ 1^h23\ 1^h24 & 2^h21\ 2^h22\ 2^h23\ 2^h24 & 18^h21\ 18^h22\ 18^h23\ 18^h24 \\ 1^h31\ 1^h32\ 1^h33\ 1^h34 & 2^h31\ 2^h32\ 2^h33\ 2^h34 \ldots & 18^h31\ 18^h32\ 18^h33\ 18^h34 \\ \cdot\ \cdot\ \cdot\ \cdot & \cdot\ \cdot\ \cdot\ \cdot & \cdot\ \cdot\ \cdot\ \cdot \\ \cdot\ \cdot\ \cdot\ \cdot & \cdot\ \cdot\ \cdot\ \cdot & \cdot\ \cdot\ \cdot\ \cdot \\ 1^h81\ 1^h82\ 1^h83\ 1^h84 & 2^h81\ 2^h82\ 2^h83\ 2^h84 & 18^h81\ 18^h82\ 18^h83\ 18^h84 \end{pmatrix}$$

wherein
(i) there are no all "0" vector;
(ii) all column vectors are different from each other;
(iii) 8 column vectors each having only one "1" are included therein;
(iv) each column vector has an odd number of "1's";
(V) the modulo-2 sum $h_A$ of any three column vectors within any block never equals any column vectors of the H-matrix (100), i.e., $$h_A = \begin{pmatrix} i^h1k \\ i^h2k \\ i^h3k \\ \cdot \\ \cdot \\ \cdot \\ i^h8k \end{pmatrix} \oplus \begin{pmatrix} i^h1l \\ i^h2l \\ i^h3l \\ \cdot \\ \cdot \\ \cdot \\ i^h8l \end{pmatrix} \oplus \begin{pmatrix} i^h1m \\ i^h2m \\ i^h3m \\ \cdot \\ \cdot \\ \cdot \\ i^h8m \end{pmatrix}$$

$$= \begin{pmatrix} i^h1k \oplus i^h1l \oplus i^h1m \\ i^h2k \oplus i^h2l \oplus i^h2m \\ i^h3k \oplus i^h3l \oplus i^h3m \\ \cdot \\ \cdot \\ \cdot \\ i^h8k \oplus i^h8l \oplus i^h8m \end{pmatrix}$$

$$\neq \begin{pmatrix} p^h1j \\ p^h2j \\ p^h3j \\ \cdot \\ \cdot \\ \cdot \\ p^h8j \end{pmatrix}$$

where i=1, 2, ..., 18; j=1, 2, 3, 4; p=1, 2, ..., 18; (k,l,m)=(2,3,4) (1,3,4), (1,2,4), (1,2,3);

(vi) the modulo-2 sum $h_B$ of four column vectors within any block i never equals the all "0" vector, i.e., $$h_B = \begin{pmatrix} i^h11 \\ i^h21 \\ i^h31 \\ \vdots \\ i^h81 \end{pmatrix} \oplus \begin{pmatrix} i^h12 \\ i^h22 \\ i^h32 \\ \vdots \\ i^h82 \end{pmatrix} \oplus \begin{pmatrix} i^h13 \\ i^h23 \\ i^h33 \\ \vdots \\ i^h83 \end{pmatrix} \oplus \begin{pmatrix} i^h14 \\ i^h24 \\ i^h34 \\ \vdots \\ i^h84 \end{pmatrix}$$

$$= \begin{pmatrix} i^h11 \oplus i^h12 \oplus i^h13 \oplus i^h14 \\ i^h21 \oplus i^h22 \oplus i^h23 \oplus i^h24 \\ i^h31 \oplus i^h32 \oplus i^h33 \oplus i^h34 \\ \vdots \\ i^h81 \oplus i^h82 \oplus i^h83 \oplus i^h84 \end{pmatrix}$$

$$\neq \begin{pmatrix} 0 \\ 0 \\ 0 \\ \vdots \\ 0 \end{pmatrix}$$

where i=1, 2, ..., 18;

(vii) the modulo-2 sum of eight column vectors within any two blocks p and q never equals the all "0" vector, i.e., $$h_C = \begin{pmatrix} p^h11 \\ p^h21 \\ p^h31 \\ \vdots \\ p^h81 \end{pmatrix} \oplus \begin{pmatrix} p^h12 \\ p^h22 \\ p^h32 \\ \vdots \\ p^h82 \end{pmatrix} \oplus \begin{pmatrix} p^h13 \\ p^h23 \\ p^h33 \\ \vdots \\ p^h83 \end{pmatrix} \oplus \begin{pmatrix} p^h14 \\ p^h24 \\ p^h34 \\ \vdots \\ p^h84 \end{pmatrix}$$

$$= \begin{pmatrix} q^h11 \\ q^h21 \\ q^h31 \\ \vdots \\ q^h81 \end{pmatrix} \oplus \begin{pmatrix} q^h12 \\ q^h22 \\ q^h32 \\ \vdots \\ q^h82 \end{pmatrix} \oplus \begin{pmatrix} q^h13 \\ q^h23 \\ q^h33 \\ \vdots \\ q^h83 \end{pmatrix} \oplus \begin{pmatrix} q^h14 \\ q^h24 \\ q^h34 \\ \vdots \\ q^h84 \end{pmatrix}$$

$$= \begin{pmatrix} p^h11 \oplus p^h12 \oplus p^h13 \oplus p^h14 \oplus q^h11 \oplus q^h12 \oplus q^h13 \oplus q^h14 \\ p^h21 \oplus p^h22 \oplus p^h23 \oplus p^h24 \oplus q^h21 \oplus q^h22 \oplus q^h23 \oplus q^h24 \\ p^h31 \oplus p^h32 \oplus p^h33 \oplus p^h34 \oplus q^h31 \oplus q^h32 \oplus q^h33 \oplus q^h34 \\ \vdots \\ p^h81 \oplus p^h82 \oplus p^h83 \oplus p^h84 \oplus q^h81 \oplus q^h82 \oplus q^h83 \oplus q^h84 \end{pmatrix}$$

$$\neq \begin{pmatrix} 0 \\ 0 \\ 0 \\ \vdots \\ 0 \end{pmatrix}$$

where p, q=1, 2, ..., 18; p≠q;
said system further comprising:
a memory unit (7);

write means (6, 19) for writing a 72-bit codeword formed by said 8 redundancy bits and 64 data bits into said memory unit (7);

read means (8, 19) for reading said 72-bit codeword from said memory unit (7);

means (10) for producing 8 syndrome bits (S0 to S7) from said 72-bit codeword in accordance with the H-matrix (100);

means (12) for decoding said 8 syndrome bits (S0 to S7) to produce a 72-bit error bit signal (EB01 to EB64, EBC0 to EBC7) showing the location of a single-bit error;

means (17) for correcting a single-bit error of said data bits (MRD01 to 64) read by said read means (8, 19) with said 64-bit error bit signal; and means (13) for determining the existence of a double-bit error, a triple-bit error within one block, a quadruple-bit error within one block, and an 8-bit burst error within two blocks by the logical operation of said error bit signal (EB01 to EB64, EBC0 to EBC7) and said 8 syndrome bits (S0 to S7).

2. An error correcting and detecting system comprising means (4') for producing 8 redundancy bits from 32 data bits in accordance with the following parity-check H-matrix (200) formed by 10 vector blocks each vector block comprising 4 column vectors $$\begin{pmatrix} i^h1j \\ i^h2j \\ i^h3j \\ \vdots \\ i^h8j \end{pmatrix}$$

where each element is 0 or 1;

i = 1, 2, ..., 10; and j = 1, 2, 3, 4; then

H = (200)

$$\begin{pmatrix} \overbrace{1^h11 \; 1^h12 \; 1^h13 \; 1^h14}^{\text{BLOCK 1}} \; \overbrace{2^h11 \; 2^h12 \; 2^h13 \; 2^h14}^{\text{BLOCK 2}} \; \cdots \; \overbrace{10^h11 \; 10^h12 \; 10^h13 \; 10^h14}^{\text{BLOCK 10}} \\ 1^h21 \; 1^h22 \; 1^h23 \; 1^h24 \; 2^h21 \; 2^h22 \; 2^h23 \; 2^h24 \; \cdots \; 10^h21 \; 10^h22 \; 10^h23 \; 10^h24 \\ 1^h31 \; 1^h32 \; 1^h33 \; 1^h34 \; 2^h31 \; 2^h32 \; 2^h33 \; 2^h34 \cdots 10^h31 \; 10^h32 \; 10^h33 \; 10^h34 \\ \vdots \\ 1^h81 \; 1^h82 \; 1^h83 \; 1^h84 \; 2^h81 \; 2^h82 \; 2^h83 \; 2^h84 \; \cdots \; 10^h81 \; 10^h82 \; 10^h83 \; 10^h84 \end{pmatrix}$$

where
(i) there are no all "0" vector;
(ii) all column vectors are different from each other;
(iii) 8 column vectors each having only one "1" are included therein;
(iv) each column vector has an odd number of "1's";
(v) the modulo-2 sum $h_A$ of any three column vectors within each block never equals any column vectors of the H-matrix (200), i.e., $$h_A = \begin{pmatrix} i^h1k \\ i^h2k \\ i^h3k \\ . \\ . \\ . \\ i^h8k \end{pmatrix} \oplus \begin{pmatrix} i^h1l \\ i^h2l \\ i^h3l \\ . \\ . \\ . \\ i^h8l \end{pmatrix} \oplus \begin{pmatrix} i^h1m \\ i^h2m \\ i^h3m \\ . \\ . \\ . \\ i^h8m \end{pmatrix}$$

$$= \begin{pmatrix} i^h1k \oplus i^h1l \oplus i^h1m \\ i^h2k \oplus i^h2l \oplus i^h2m \\ i^h3k \oplus i^h3l \oplus i^h3m \\ . \\ . \\ . \\ i^h8k \oplus i^h8l \oplus i^h8m \end{pmatrix}$$

$$\neq \begin{pmatrix} p^h1j \\ p^h2j \\ p^h3j \\ . \\ . \\ . \\ p^h8j \end{pmatrix}$$

where i=1, 2, ..., 10; j=1, 2, ..., 4,: p=1, 2, ..., 10; (k,l,m)=(2,3,4) (1,3,4), (1,2,4) (1,2,3);

(vi) The modulo-2 sum $h_B$ of four column vectors within any block i never equals to all "0" vector i.e., $$h_B = \begin{pmatrix} i^h11 \\ i^h21 \\ i^h31 \\ . \\ . \\ . \\ i^h81 \end{pmatrix} \oplus \begin{pmatrix} i^h12 \\ i^h22 \\ i^h32 \\ . \\ . \\ . \\ i^h82 \end{pmatrix} \oplus \begin{pmatrix} i^h13 \\ i^h23 \\ i^h33 \\ . \\ . \\ . \\ i^h83 \end{pmatrix} \oplus \begin{pmatrix} i^h14 \\ i^h24 \\ i^h34 \\ . \\ . \\ . \\ i^h84 \end{pmatrix}$$

$$= \begin{pmatrix} i^h11 \oplus i^h12 \oplus i^h13 \oplus i^h14 \\ i^h21 \oplus i^h22 \oplus i^h23 \oplus i^h24 \\ i^h31 \oplus i^h32 \oplus i^h33 \oplus i^h34 \\ . \\ . \\ . \\ i^h81 \oplus i^h82 \oplus i^h83 \oplus i^h84 \end{pmatrix}$$

$$\neq \begin{pmatrix} 0 \\ 0 \\ 0 \\ . \\ . \\ 0 \end{pmatrix}$$

where i=1, 2, ..., 10, (vii) the modulo-2 sum of eight column vectors within any two block p and q of never equals at the all column vectors within any two blocks p and and q never eqals the all "0" vector, i.e.., $$h_C = \begin{pmatrix} p^h11 \\ p^h21 \\ p^h31 \\ . \\ . \\ . \\ p^h81 \end{pmatrix} \oplus \begin{pmatrix} p^h12 \\ p^h22 \\ p^h32 \\ . \\ . \\ . \\ p^h82 \end{pmatrix} \oplus \begin{pmatrix} p^h13 \\ p^h23 \\ p^h33 \\ . \\ . \\ . \\ p^h83 \end{pmatrix} \oplus \begin{pmatrix} p^h14 \\ p^h24 \\ p^h34 \\ . \\ . \\ . \\ p^h84 \end{pmatrix}$$

$$= \begin{pmatrix} q^h11 \\ q^h21 \\ q^h31 \\ . \\ . \\ . \\ q^h81 \end{pmatrix} \oplus \begin{pmatrix} q^h12 \\ q^h22 \\ q^h32 \\ . \\ . \\ . \\ q^h82 \end{pmatrix} \oplus \begin{pmatrix} q^h13 \\ q^h23 \\ q^h33 \\ . \\ . \\ . \\ q^h83 \end{pmatrix} \oplus \begin{pmatrix} q^h14 \\ q^h24 \\ q^h34 \\ . \\ . \\ . \\ q^h84 \end{pmatrix}$$

$$= \begin{pmatrix} p^h11 \oplus p^h12 \oplus p^h13 \oplus p^h14 \oplus q^h11 \oplus q^h12 \oplus q^h13 \oplus q^h14 \\ p^h21 \oplus p^h22 \oplus p^h23 \oplus p^h24 \oplus q^h21 \oplus q^h22 \oplus q^h23 \oplus q^h24 \\ p^h31 \oplus p^h32 \oplus p^h33 \oplus p^h34 \oplus q^h31 \oplus q^h32 \oplus q^h33 \oplus q^h34 \\ . \\ . \\ . \\ p^h81 \oplus p^h82 \oplus p^h83 \oplus p^h84 \oplus q^h81 \oplus q^h82 \oplus q^h83 \oplus q^h84 \end{pmatrix}$$

$$\neq \begin{pmatrix} 0 \\ 0 \\ 0 \\ . \\ . \\ 0 \end{pmatrix}$$

where p, q=1, 2, ..., 10: p≠q;

said system further comprising:

a memory unit (7):

write means (6, 19) for writing a 40-bit codeword formed by said 8 redundancy bits and 32 data bits into said memory unit (7);

read means (8, 19) for reading said 10-bit codeword from said memory unit (7);

means (10′) for producing 8 syndrome bits (S0 to S7) from said 40-bit codeword in accordance with the H-matrix (200);

means (12′) for decoding said 8 syndrome bits (S0 to S7) to produce a 40-bit error bit signal (EB01 to EB32, EBC0 to EBC7) showing the location of a single-bit error;

means (17′) for correcting a single-bit error of said data bits (MRD01 to 32) read by said read means (8, 19) with said 64-bit error bit signal; and means (13′) for determining the existence of a double-bit error, a triple-bit error within one block a quadruple-bit error within one block, and an 8-bit burst error within two blocks by the logical operation of said error bit signal (EB01 to EB32, EBC0 to EBC7) and said 8 syndrome bits (S0 to S7).

3. An error correcting and detecting system-comprising means (4″) for producing redundancy bits from 32 data bits in accordance with the following parity-check H-matrix (300) formed by 9 first vector blocks and a second vector block each first vector block comprising 4 column vectors $$\begin{pmatrix} i^h1j \\ i^h2j \\ i^h3j \\ . \\ . \\ . \\ i^h8j \end{pmatrix}$$

where each element is 0 or 1;
i=1, 2, ..., 9; and $j = 1, 2, 3, 4;$ said second vector block comprising 3 column vectors $$\begin{pmatrix} i^h1j \\ i^h2j \\ i^h3j \\ . \\ . \\ . \\ i^h8j \end{pmatrix}$$

wherein each element is 0 or 1;

$i = 10$, and $j = 1, 2, 3$, then $$H = \overbrace{\begin{pmatrix} 1^h11 \ 1^h12 \ 1^h13 \ 1^h14 \ 2^h11 \ 2^h12 \ 2^h13 \ 2^h14 & 10^h11 \ 10^h12 \ 10^h13 \\ 1^h21 \ 1^h22 \ 1^h23 \ 1^h24 \ 2^h21 \ 2^h22 \ 2^h23 \ 2^h24 & 10^h21 \ 10^h22 \ 10^h23 \\ 1^h31 \ 1^h32 \ 1^h33 \ 1^h34 \ 2^h31 \ 2^h32 \ 2^h33 \ 2^h34 \ldots & 10^h31 \ 10^h32 \ 10^h33 \\ . & . \\ . & . \\ . & . \\ 1^h71 \ 1^h72 \ 1^h73 \ 1^h74 \ 2^h71 \ 2^h72 \ 2^h73 \ 2^h74 & 10^h71 \ 10^h72 \ 10^h73 \end{pmatrix}}^{\text{BLOCK 1, BLOCK 2, \ldots BLOCK 10}} \quad (300)$$

where
(i) there are no all "0" vector;
(ii) all column vectors are different from each
(iii) 8 column vectors each having only one "1" is included therein;
(iv) each column vector has an odd number of "1's";
(v) the modulo-2 sum $h_A$ of any three column vectors within any never equals any column vectors of the H-matrix (300), i.e., $$h_A = \begin{pmatrix} i^h1k \\ i^h2k \\ i^h3k \\ . \\ . \\ . \\ i^h8k \end{pmatrix} \oplus \begin{pmatrix} i^h11 \\ i^h21 \\ i^h31 \\ . \\ . \\ . \\ i^h81 \end{pmatrix} \oplus \begin{pmatrix} i^h1m \\ i^h2m \\ i^h3m \\ . \\ . \\ . \\ i^h8m \end{pmatrix}$$

$$= \begin{pmatrix} i^h1k \oplus i^h11 \oplus i^h1m \\ i^h2k \oplus i^h21 \oplus i^h2m \\ i^h3k \oplus i^h31 \oplus i^h3m \\ . \\ . \\ . \\ i^h8k \oplus i^h81 \oplus i^h8m \end{pmatrix}$$

$$\neq \begin{pmatrix} p^h1j \\ p^h2j \\ p^h3j \\ . \\ . \\ . \\ p^h8j \end{pmatrix}$$

where $i = 1, 2, \ldots, 10$; $j = 1, 2, 3, 4$; $p = 1, 2, \ldots, 18$; $(k,l,m) = (2,3,4) \ (1,3,4) \ (1,2,4) \ (1,2,3)$;

(vi) the modulo-2 sum $h_B$ of four column vectors within any block i never equals the all "0" vector, i.e., $$h_B = \begin{pmatrix} i^h11 \\ i^h21 \\ i^h31 \\ . \\ . \\ . \\ i^h81 \end{pmatrix} \oplus \begin{pmatrix} i^h12 \\ i^h22 \\ i^h32 \\ . \\ . \\ . \\ i^h82 \end{pmatrix} \oplus \begin{pmatrix} i^h13 \\ i^h23 \\ i^h33 \\ . \\ . \\ . \\ i^h83 \end{pmatrix} \oplus \begin{pmatrix} i^h14 \\ i^h24 \\ i^h34 \\ . \\ . \\ . \\ i^h84 \end{pmatrix}$$

$$= \begin{pmatrix} i^h11 \oplus i^h12 \oplus i^h13 \oplus i^h14 \\ i^h21 \oplus i^h22 \oplus i^h23 \oplus i^h24 \\ i^h31 \oplus i^h32 \oplus i^h33 \oplus i^h34 \\ . \ . \ . \ . \ . \ . \\ . \ . \ . \ . \ . \ . \\ i^h81 \oplus i^h82 \oplus i^h83 \oplus i^h84 \end{pmatrix}$$

$$\neq \begin{pmatrix} 0 \\ 0 \\ 0 \\ . \\ . \\ . \\ 0 \end{pmatrix}$$

where $i = 1, 2, \ldots, 9$;

(vii) the modulo-2 sum of eight column vectors within any two blocks p and q never equals the all "0" vector, i.e., $$h_C = \begin{pmatrix} p^h11 \\ p^h21 \\ p^h31 \\ . \\ . \\ . \\ p^h81 \end{pmatrix} \oplus \begin{pmatrix} p^h12 \\ p^h22 \\ p^h32 \\ . \\ . \\ . \\ p^h82 \end{pmatrix} \oplus \begin{pmatrix} p^h13 \\ p^h23 \\ p^h33 \\ . \\ . \\ . \\ p^h83 \end{pmatrix} \oplus \begin{pmatrix} p^h14 \\ p^h24 \\ p^h34 \\ . \\ . \\ . \\ p^h84 \end{pmatrix}$$

$$= \begin{pmatrix} q^h11 \\ q^h21 \\ q^h31 \\ . \\ . \\ . \\ q^h81 \end{pmatrix} \oplus \begin{pmatrix} q^h12 \\ q^h22 \\ q^h32 \\ . \\ . \\ . \\ q^h82 \end{pmatrix} \oplus \begin{pmatrix} q^h13 \\ q^h23 \\ q^h33 \\ . \\ . \\ . \\ q^h83 \end{pmatrix} \oplus \begin{pmatrix} q^h14 \\ q^h24 \\ q^h34 \\ . \\ . \\ . \\ q^h84 \end{pmatrix}$$

$$= \begin{pmatrix} p^h11 \oplus p^h12 \oplus p^h13 \oplus p^h14 \oplus q^h11 \oplus q^h12 \oplus q^h13 \oplus q^h14 \\ p^h21 \oplus p^h22 \oplus p^h23 \oplus p^h24 \oplus q^h21 \oplus q^h22 \oplus q^h23 \oplus q^h24 \\ p^h31 \oplus p^h32 \oplus p^h33 \oplus p^h34 \oplus q^h31 \oplus q^h32 \oplus q^h33 \oplus q^h34 \\ . \ . \ . \ . \ . \ . \ . \ . \\ . \ . \ . \ . \ . \ . \ . \ . \\ p^h81 \oplus p^h82 \oplus p^h83 \oplus p^h84 \oplus q^h81 \oplus q^h82 \oplus q^h83 \oplus q^h84 \end{pmatrix}$$

$$\neq \begin{pmatrix} 0 \\ 0 \\ 0 \\ . \\ . \\ . \\ 0 \end{pmatrix}$$

where $p, q = 1, 2, \ldots, 19$; $p \neq q$;
said system further comprising:
a memory unit (7);
write means (6, 19) for writing a 39-bit codeword formed by said 7 redundancy bits and 64 data bits into said memory unit (7);
read means (8, 19) for reading said 39-bit codeword from said memory unit (7);

means (10") for producing 7 syndrome bits (S0 to S6) from said 39-bit codeword in accordance with the H-matrix (100);

means (12") for decoding said 7 syndrome bits (S0 to S6) to produce a 39-bit error bit signal (EB01 to EB32, EBC0 to EBC6) showing the location of a single-bit error;

means (17") for correcting a single-bit error of said data bits (MRD01 to 32) read by said read means (8, 19) with said 32-bit error bit signal; and means (13") for determining the existence of a double-bit error, a triple-bit error within one block, a quadruple-bit error within one block, and an 8-bit burst error within two blocks by the logical operation of said error bit signal (EB01 to EB32, EBC0 to EBC6) and said 7 syndrome bits (S0 to S6).

4. A system as set forth in claim 1, 2, or 3, wherein said redundancy bit producing means (4, 4', 4") comprises a plurality of groups of exclusive OR circuits, each group performing a modulo-2 sum operation upon the data bits corresponding to the "1" element of one row of the H-matrix.

5. A system as set forth in claim 1, 2, or 3, wherein said syndrome bit producing means (10, 10', 10") comprises a plurality of groups of exclusive OR circuits, each group performing a modulo-2 sum operation upon the data bits and the redundancy bits corresponding to the "1" element of one row of the H-matrix.

6. A system as set forth in claim 1, 2, or 3, wherein said syndrome decoding means (12, 12', 12") comprises a plurality of gate circuits (1201 to 1264, 1201' to 1240", 1201" to 1239") each provided for one of the data bits, for decoding said syndrome bits.

7. A system as set forth in claim 1, 2, or 3, wherein said error correcting means (17, 17', 17") comprises a plurality of exclusive OR circuits (1701 to 1772, 1701' to 1740', 1701" to 1739"), each receiving one of said read data bits (MRD01 to 64, MRD01 to 32) from said read means (8, 19) and one of said error bit signals (EB01 to EB64, EBC0 to EBC7, EB01 to EB32, EBC0 to EBC7, EB01 EBC32, EBC0 to EBC6) of said syndrome decoding means (12, 12', 12").

8. A system as set forth in claim 1, 2, or 3, wherein said error determining means (13, 13', 13") comprises:

OR circuit means (1301 to 1309, 1311, 1301' to 1305', 1307', 1301" to 1305", 1307"), connected to said syndrome decoding means (12, 12', 12"), for detecting a single-bit error to produce a single-bit error signal (SBE);

an OR circuit (1310, 1306', 1306"), connected to receive said syndrome bits (S0 to S7, S0 to S6) from said syndrome generating means (10, 10', 10"), for producing an error signal (ERROR); and a gate circuit (1312, 1308', 1308"), connected to said OR circuit means and said OR circuit, for producing a multiple-bit error signal (MBE) only when receiving said-error signal (ERROR) with no single-bit error signal (SBE).

* * * * *